(12) United States Patent
Ishizuka

(10) Patent No.: US 8,407,539 B2
(45) Date of Patent: Mar. 26, 2013

(54) SEMICONDUCTOR DEVICE TEST CIRCUIT, SEMICONDUCTOR DEVICE, AND ITS MANUFACTURING METHOD

(75) Inventor: Satoshi Ishizuka, Kanagawa (JP)

(73) Assignee: Renesas Electronics Corporation, Kawasaki-shi, Kanagawa ( * ) Notice: Subject to any disclaimer, the term of this patent is extended or adjusted under 35 U.S.C. 154(b) by 521 days.

(21) Appl. No.: 12/656,974

(22) Filed: Feb. 22, 2010

(65) Prior Publication Data

US 2010/0229057 A1 Sep. 9, 2010

(30) Foreign Application Priority Data

Mar. 3, 2009 (JP) .................................. 2009-049285

(51) Int. Cl.
*G01R 31/28* (2006.01)
(52) U.S. Cl. .................. 714/726; 714/724; 714/727
(58) Field of Classification Search .................. None
See application file for complete search history.

(56) References Cited

U.S. PATENT DOCUMENTS

| | | | |
|---|---|---|---|
| 5,107,208 A * | 4/1992 | Lee ............................... | 714/733 |
| 5,515,505 A * | 5/1996 | Ishizuka ........................ | 714/30 |
| 5,651,013 A * | 7/1997 | Iadanza ......................... | 714/731 |
| 5,802,270 A * | 9/1998 | Ko et al. ........................ | 714/27 |
| 6,347,381 B1 * | 2/2002 | McClure ........................ | 714/30 |
| 7,251,766 B2 * | 7/2007 | Kato .............................. | 714/733 |
| 2006/0190785 A1 * | 8/2006 | Pilling .......................... | 714/726 |
| 2006/0218455 A1 * | 9/2006 | LeClair et al. ................ | 714/726 |

FOREIGN PATENT DOCUMENTS

| | | |
|---|---|---|
| JP | 56-108242 | 8/1981 |
| JP | 9-89996 | 4/1997 |
| JP | 10-135790 | 5/1998 |
| JP | 2006-132992 | 5/2006 |

* cited by examiner

*Primary Examiner* — Gabriel Chu
(74) *Attorney, Agent, or Firm* — McGinn IP Law Group, PLLC

(57) ABSTRACT

The test circuit can apply a stress to each node of each object combinational circuit in the semiconductor device and suppress the semiconductor circuit overhead when in burn-in or leak test operations for the semiconductor device while it has been impossible to apply such a stress to any of such nodes only with use of an F/F circuit in any conventional environments. The test circuit is disposed in the semiconductor and combined with first and second combinational circuits therein. In the semiconductor device, a transfer gate switch is connected between first and second nodes and a first transistor is connected between the second node and a power supply. The second transistor is connected between the second node and a ground. Each of the transfer gate switch and the first and second transistors operates according to at least one of the control signals supplied from outside the semiconductor device.

5 Claims, 21 Drawing Sheets

| TM1 INPUT | TM2 INPUT | TDN1 OUTPUT | TDN2 OUTPUT |
|---|---|---|---|
| LOW | — | HIGH | LOW |
| HIGH | LOW | LOW | LOW |
| HIGH | HIGH | HIGH | HIGH |

| TM1 INPUT | CLK INPUT | TDN1 OUTPUT | TDN2 OUTPUT |
|---|---|---|---|
| LOW | — | HIGH | LOW |
| HIGH | CLOCK | CLOCK | CLOCK |

SEMICONDUCTOR DEVICE TEST CIRCUIT, SEMICONDUCTOR DEVICE, AND ITS MANUFACTURING METHOD

FIELD OF THE INVENTION

The present invention relates to a test circuit to be used for burn-in and leak tests and more particularly to a circuit that applies a stress to each node of each object combinational circuit when in such burn-in and leak tests.

BACKGROUND OF THE INVENTION

In recent years, the reliability requirements of semiconductor devices have been set higher and higher. And in order to meet such requirements, there have been invented and employed various test methods and test circuits. Among those test methods, there is a burn-in test, which applies a stress to each object semiconductor device so as to quicken the appearance of physical deterioration and detects semiconductors having latent trouble factors as defective ones. There is also a leak test employed often to detect a short circuit between a signal wiring and another signal wiring or power wiring as an increase of the supply current.

In case of burn-in tests, it is considered to be ideal to apply a stress to every transistor gate in the object internal circuit of the target semiconductor device so that the power supply or ground potential is supplied evenly to them in point of time. In case of leak tests, it is considered to be ideal to vary the potential of each object node of the internal circuit of the semiconductor device to the power supply potential and the ground potential and measure the supply current in each state of the varied potential.

As shown in FIG. 23, an ordinary semiconductor device includes combinational circuits 301 to 303 and flip-flop (hereunder, to be described as F/F) circuits 401 to 406. And in order to improve the defective detection rate, the semiconductor device is provided with a scan test path 501 to which those F/F circuits are connected serially only in test operation. Consequently, a scan path test is also adopted together with such burn-in and leak tests. In case of such a scan path test, given data is inputted from a scan data input terminal 201 and stored in an F/F circuit, thereby it becomes possible to set the value stored in the F/F circuit disposed between combinational circuits inside the subject semiconductor device from external.

In order to realize an ideal burn-in test as far as possible, the scan path test is carried out together with a burn-in test to activate circuits in a range as widely as possible (e.g., patent gazette JP-A-H9 (1997)-089996). Even when there is any F/F circuit that cannot be included in a scan chain in a large-scale semiconductor device, there is a method capable of applying a stress to each object efficiently. According to the method, the output of the F/F is toggled so that the combinational circuit that receives the F/F output is activated as far as possible, thereby improving the stress application efficiency (e.g., patent gazettes JP-A-2006-132992 and JP-A-H10 (1998)-135790). Patent gazette JP-A-S56 (1981)-108242 will be described later.

SUMMARY OF THE INVENTION

However, a burn-in test, if a scan path test is included in that, can activate each circuit in the subject semiconductor device at a high percentage, but there are still some inactive circuits left over in the combinational circuit connected to an F/F circuit that is not included in the scan chain.

In case of such an F/F circuit that cannot be included in a scan chain, the F/F output can be toggled by any of the methods disclosed in the patent gazettes JP-A-2006-132992 and JP-A-H10 (1998)-135790, but the combinational circuit connected to such an F/F circuit cannot be activated. In order to set the potential of each node in such an inactive combinational circuit to the power supply or ground potential level, a scan pattern must be generated by taking consideration to every logic of the combinational circuit. In this case, however, even when a huge number of scan patterns are generated for a large-scale semiconductor in recent years, it is still difficult to fix the potential level in each of the internal nodes of the subject combinational circuit disposed in a deep layer from the external terminal and the F/F circuit. Similarly, simple toggling of the output of such an F/F circuit that cannot be included in a scan chain is insufficient for the consideration to the logic of the combinational circuit that receives the output from the F/F. This is why the conventional techniques cause some inactive combinational circuits to be left over.

However, even such an inactive node can be activated by adding a test F/F circuit to the subject combinational circuit. In this case, each F/F circuit comes to include plural transfer gate switches and logic circuits, and furthermore each F/F circuit comes to include many more transistors than such an inverter block or the like. And if a node is provided with many test F/F circuits, the semiconductor circuit overhead increases significantly. And it is difficult to add test F/F circuits to such an inactive node one by one.

Under such circumstances, it is an object of the present invention to dispose a test circuit in the object semiconductor device so as to be connected to a combinational circuit therein. The test circuit includes a first switching circuit connected between a first node and a second node; a second switching circuit connected between a first potential and the second node; and a third switching circuit connected between a second potential that is lower than the first potential and the second node. Each of the first to third switching circuits is turned on/off according to at least one of the control signals supplied from outside the semiconductor device.

It is another object of the present invention to provide a semiconductor device manufacturing method. The method includes a step of disposing a test circuit provided with first to third switching circuits in the semiconductor device so as to be connected to a combinational circuit therein. The first switching circuit is connected between a first node and a second node. The second switching circuit is connected between a first potential and the second node. The third switching circuit is connected between a second potential that is lower than the first potential and the second node.

According to the present invention, therefore, it is possible to dispose this test circuit for a node to which a stress cannot be applied only with use of an F/F circuit, thereby the stress can be applied to the node. Furthermore, because this test circuit is disposed in the subject semiconductor device so as to be connected to a combinational circuit therein, the semiconductor circuit overhead can be suppressed.

This is why the present invention can provide a test circuit, a semiconductor device, and its manufacturing method, each of which enables a stress to be applied to each node of each object combinational circuit to which such a stress cannot be applied only with use of an F/F circuit and enables the semiconductor circuit overhead to be suppressed when in burn-in or leak test operation for the semiconductor device.

DETAILED DESCRIPTION OF THE PREFERRED EMBODIMENTS

Hereunder, there will be described the preferred embodiments of the present invention with reference to the accompanying drawings. In the following descriptions, it is premised that while a LOW signal is inputted to such a part as a node, a LOW level, that is, a ground level potential is applied to the part and while a HIGH signal is inputted to the part, a HIGH level, that is, a power supply level potential is applied to the part.

First Embodiment

At first, there will be described a configuration of a test circuit 1, as well as configurations of its peripheral circuits in the first embodiment of the present invention with reference to the block diagram shown in FIG. 1. The test circuit 1 includes a transfer gate switch TG consisting of a PMOS (Positive-channel Metal Oxide Semiconductor) transistor and an NMOS (Negative-channel Metal Oxide Semiconductor) transistor. The test circuit 1 also includes a first transistor (PMOS) T1 connected between a power supply VDD and a node N2 and a second transistor (NMOS) T2 connected between a ground GND and the node N2.

The node N1 connected to a combinational circuit 31 and the node 2 connected to another combinational circuit 32 are connected to each other through the transfer gate switch TG. A test mode control terminal TM1 is connected to the PMOS transistor of the transfer gate switch TG so as to have a positive logic and to the NMOS transistor so as to have an inverted logic generated by an inverter logic block INV1. Another test mode control terminal TM2 is connected to the first transistor T1 and still another test mode control terminal TM3 is connected to the second transistor T2.

Figure 2:
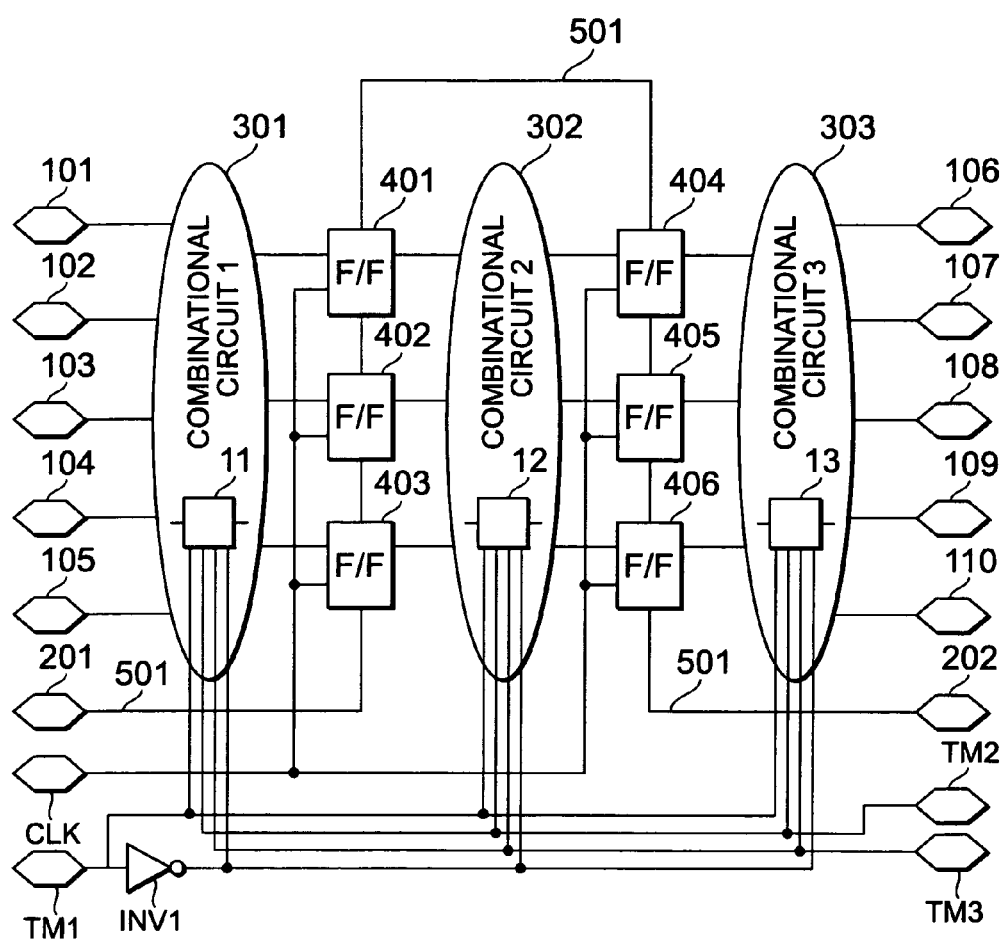
FIG. 2 is a block diagram of a semiconductor device that includes the test circuit in the first embodiment of the present invention.

Next, there will be described a configuration of a semiconductor device that includes the test circuit 1 with reference to the block diagram shown in FIG. 2. In this semiconductor device, as shown in FIG. 2, combinational circuits 301 to 303, flip-flop circuits 401 to 406, and external terminals 101 to 110 are connected to each another. The combinational circuits 301 to 303 include built-in test circuits 11 to 13 that are the same in configuration as the test circuit 1 respectively. The test mode control terminals TM1 to TM3 connected to the test circuits 11 to 13 and the inverter logic block INV1 connected to the test mode control terminal TM1 are grouped into one set so as to be prepared for the semiconductor device. The same control signals are used commonly among those circuits. Furthermore, the flip-flop circuits 401 to 406, a scan data input terminal 201, and a scan data output terminal 202 are connected to each another through a scan test path 501. The flip-flop circuits 401 to 406 are connected to a scan clock terminal CLK that supplies a clock signal when in scan test operation.

Next, there will be described the operation of the test circuit 1 with reference to FIG. 1. If another test such as a scan test is to be carried out while the semiconductor device is operating as usually, the test circuit 1 must be invalidated. And to invalidate the test circuit 1, a LOW signal is inputted to the test mode control terminal TM1 to turn on the transfer gate switch TG, thereby the nodes N1 and N2 are connected to each other electrically. Then, a HIGH signal is inputted to the test mode control terminal TM2 to turn off the first transistor T1, thereby the node 2 is disconnected from the power supply VDD. After this, a LOW signal is inputted to the test mode control terminal TM3 to turn off the second transistor T2, thereby the node N2 is disconnected from the ground GND. As a result, only the electrical connection between the nodes N1 and N2 is kept, thereby the test circuit 1 connected between the combinational circuits 31 and 32 is invalidated.

To carry out a burn-in or leak test for the semiconductor device, the test circuit 1 must be validated. And to validate the test circuit 1, a HIGH signal is inputted to the test mode control terminal TM1 to turn off the transfer gate switch TG, thereby the nodes N1 and N2 are disconnected from each other. As a result, the combinational circuits 31 and 32 are disconnected from each other, thereby the test circuit 1 is validated.

To apply a HIGH level stress to the node N2, a LOW signal is inputted to the test mode control terminal TM2 to turn on the first transistor T1, thereby the node N2 is connected to the power supply VDD. Then, a LOW signal is inputted to the test mode control terminal TM3 to turn off the second transistor T2, thereby the node N2 is disconnected from the ground GND. As a result, the transfer gate switch TG is turned off, thereby a through-current comes to flow between the node N1 and the power supply VDD through the first transistor T1 even when the signal state of the node N1 is unstable or on the LOW level. Furthermore, because the second transistor T2 is also off at this time, no through-current flows between the node N2 and the ground GND through the second transistor T2. This is why a HIGH level stress can be applied only to the node N2.

To apply a LOW level stress to the node N2, a HIGH signal is inputted to the test mode control terminal TM2 to turn off the first transistor T1 and disconnect the node N2 from the power supply VDD. Then, a HIGH signal is inputted to the test mode control terminal TM3 to turn on the second transistor T2 and connect the node N2 to the ground GND. Consequently, because the transfer gate switch TG is off at this time, no through-current flows between the node N1 and the ground GND through the second transistor T2 even when the signal status of the node N1 is unstable or on the HIGH level. And because the first transistor T1 is also off at this time, no through-current flows between the node N2 and the power supply VDD through the first transistor T1. This is why a LOW level stress can be applied only to the node N2.

This means that while the test circuit 1 is validated, the node N2 can be set on any of the HIGH and LOW levels. Therefore, if a proper signal is inputted to the test mode control terminals TM1 to 3 at this time, the integrated time of stress application to the node N2 can be equalized between HIGH and LOW levels.

Furthermore, while the signal level of the node N2 is HIGH, the short circuit between the node N2 and the ground GND can be detected and while the signal level of the node N2 is LOW, the short-circuit between the node N2 and the power supply VDD can be detected by measuring a leak current therefrom respectively.

Next, there will be described the circuit operation of the semiconductor device shown in FIG. 2. If another test such as a scan test is to be carried out while the semiconductor device is operating as usually, the test circuits 11 to 13 must be invalidated by the method described above. With this invalidation, the test circuits 11 to 13 come to give no influences to the regular operations of the semiconductor device and the scan test operation.

To carry out a burn-in or leak test for the semiconductor device, the signals must be inputted through the external terminals 101 to 110 respectively. In this case, the flip-flop circuits 401 to 406 input scan data signals from the scan data input terminal 201 through the scan test path 501 to which the flip-flop circuits 401 to 406 are connected so as to be used as shift registers respectively. Furthermore, the flip-flop circuits 401 to 406 input scan clock signals from the scan clock terminal CLK so that the data held by those flip-flop circuits 401 to 406 can be set from external. Consequently, the flip-flop circuits 401 to 406 combined to form a scan chain, as well as the nodes of the combinational circuits 301 to 303 can be set on the High or LOW level respectively. Because the signals inputted from the external terminals 101 to 110 are combined with scan data in such a way, the flip-flop circuits that form the scan chain, as well as the nodes in most of the combinational circuits can be set to the power supply or ground level. However, no stress levels can be set for some flip-flop circuits that are not included in the scan chain, as well as some nodes in some combinational circuits that can be set only with complicated signal combinations respectively.

In spite of this, a HIGH or LOW level stress can be applied even to such nodes in which any of the above-described stress levels cannot be set if the test circuits 11 to 13 are validated by the above method and control signals are inputted to the test mode control terminals TM2 and TM3 respectively.

Consequently, the test circuit 1 can be used to activate even such nodes in which any of the above stress levels cannot be set. Furthermore, the test mode control terminal TM1 to TM3 can be controlled so that the integrated time of stress application is equalized between HIGH and LOW levels, thereby an ideal burn-in test operation can be realized. In case of the leak test, if the leak is measured by plural times by switching the object node between HIGH and LOW levels, the short circuit between each node and the power supply VDD/ground GND can be detected comprehensively.

Second Embodiment

Figure 3:
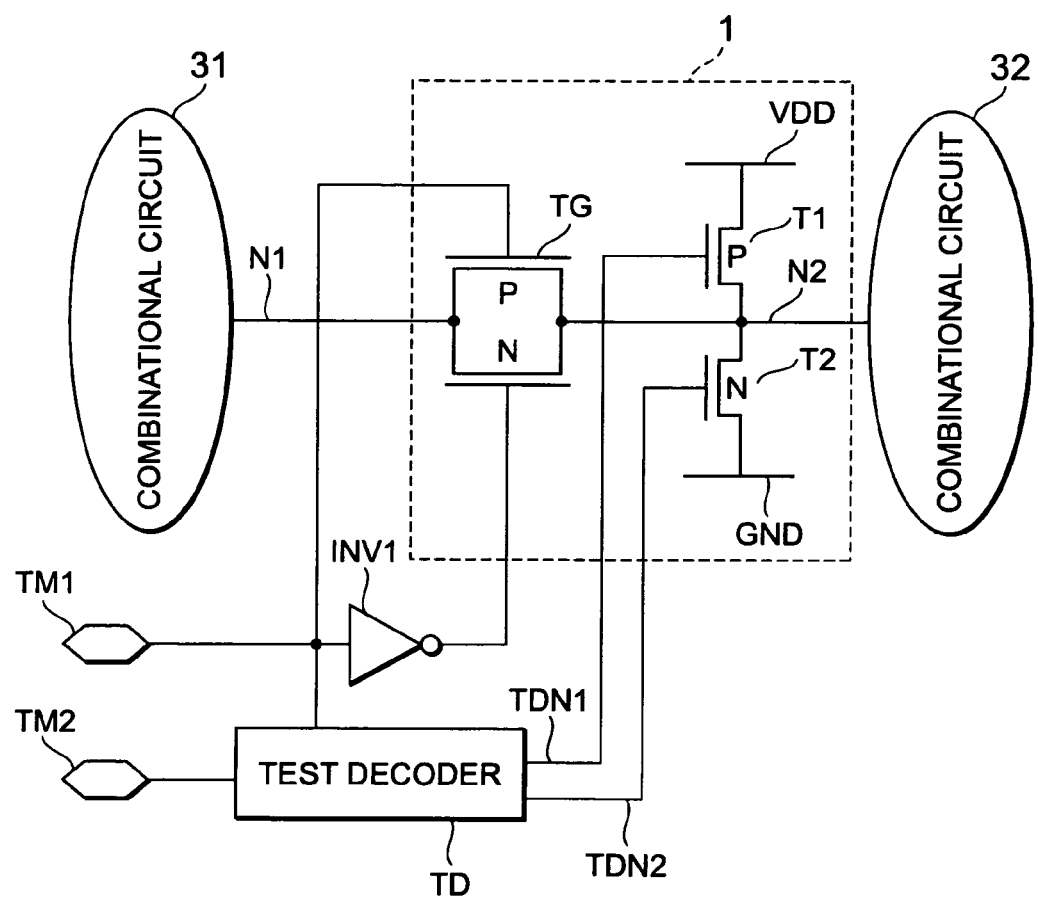
FIG. 3 is a block diagram for describing configurations of a test circuit and its peripheral circuits in the second embodiment of the present invention.

Next, there will be described a configuration of a test circuit 1 and configurations of its peripheral circuits in this second embodiment with reference to the block diagram shown in FIG. 3. The test circuit 1 is the same in configuration as that shown in FIG. 1, so that its description will be omitted here.

A node N1 connected to a combinational circuit 31 and another node N2 connected to another combinational circuit 32 are connected to each other through a transfer gate switch TG. A test mode control terminal TM1 is connected to a PMOS transistor of the transfer gate switch TG and a test decoder TD so as to have a positive logic respectively while the test mode control terminal TM1 is connected to an NMOS transistor of the transfer gate switch TG so as to have an inverted logic generated by an inverter logic block INV1. The test mode control terminal TM2 is connected to the test decoder TD. The test decoder TD is connected to the first transistor T1 through a test decoder output signal node TDN1 and to the second transistor T2 through a test decoder output signal node TDN2.

Figures 4, 5:
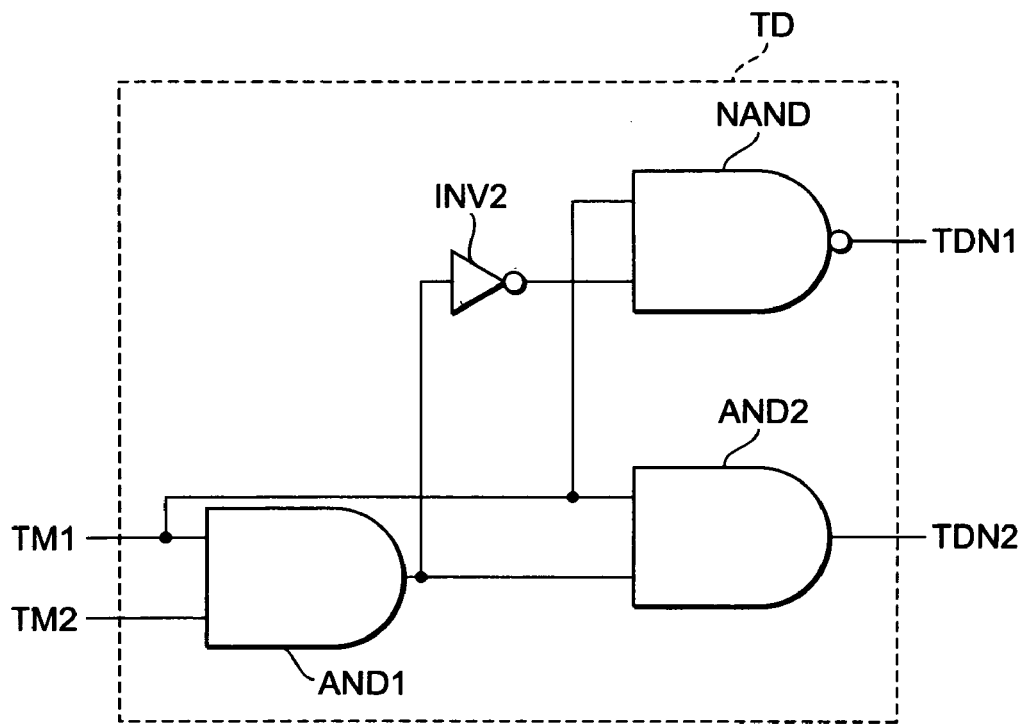
FIG. 4 is a block diagram of a configuration of a test decoder in the second embodiment of the present invention.
FIG. 5 is a truth table of the test decoder in the second embodiment of the present invention.

As shown in the block diagram of FIG. 4, the test decoder TD is configured by an AND logic block AND1, an AND logic block AND2, an inverter logic block INV2, and a NAND logic block NAND. The AND logic block AND1 inputs signals from the test mode control terminal TM1 and TM2. The AND logic block AND2 inputs signals from the test mode control terminal TM1 and the AND logic block AND1 and outputs signals to the test decoder output signal node TDN2. The inverter logic block INV2 inputs signals that are output from the AND logic block AND1. The NAND logic block NAND inputs signals that are output from the test mode control terminal TM1 and the inverter logic block INV2, and outputs signals to the test decoder output signal node TDN1.

Figure 6:
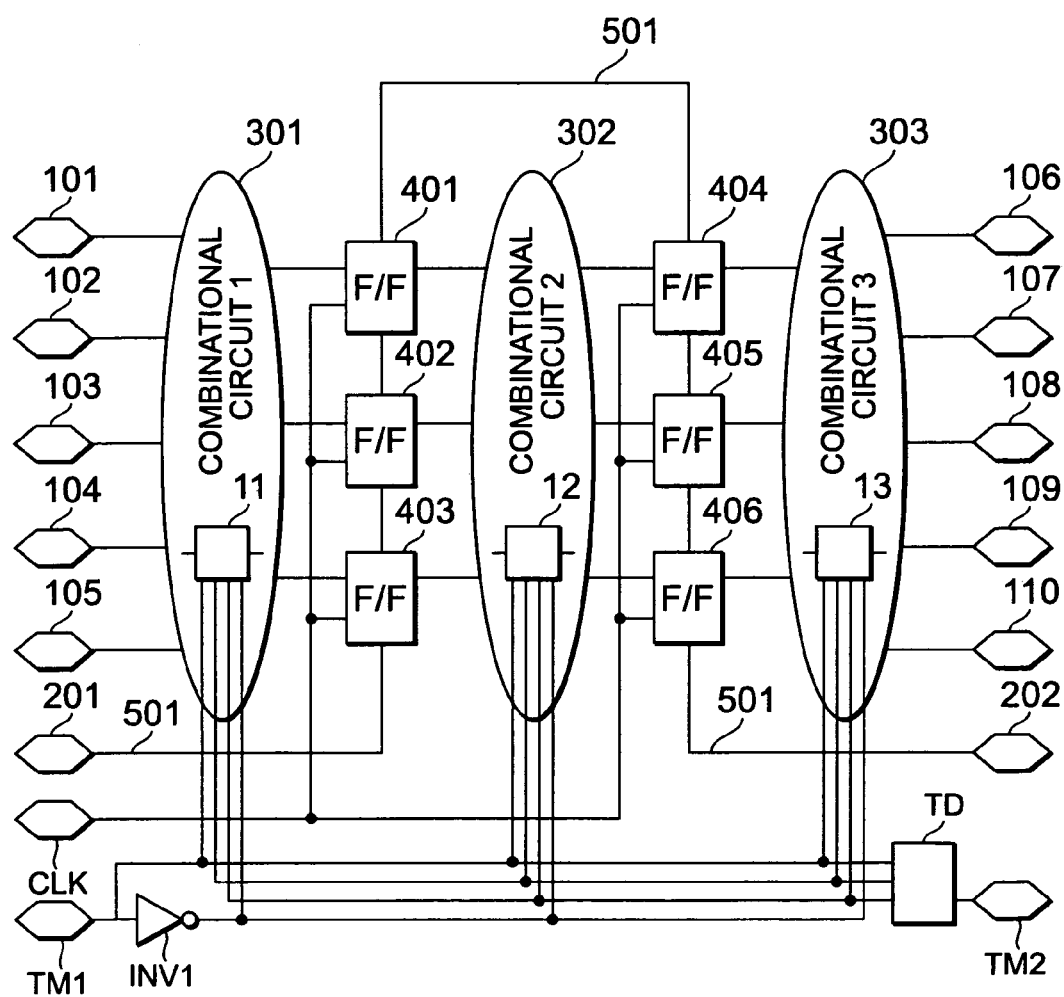
FIG. 6 is a block diagram of a semiconductor device that includes the test circuit in the second embodiment of the present invention.

Next, there will be described a configuration of a semiconductor device that includes the built-in test circuit 1 with reference to the block diagram shown in FIG. 6. In this semiconductor device, as shown in FIG. 6, combinational circuits 301 to 303, flip-flop circuits 401 to 406, and external terminals 101 to 110 of the semiconductor device are connected to each another. In the combinational circuits 301 to 303 are built test circuits 11 to 13 that are the same in configuration as the test circuit 1. A test mode control terminal TM1 connected to the test circuits 11 to 13 and the test decoder TD, another test mode control terminal TM2 connected to the test decoder TD, an inverter logic block INV1 connected to the test mode control terminal TM1, and the test decoder TD are grouped into one set so as to be prepared for the semiconductor device. The same control signals are used commonly among those circuits. Furthermore, the flip-flop circuits 401 to 406, the scan data input terminal 201, and the scan data output terminal 202 are connected to each another through the scan test path 501. The flip-flop circuits 401 to 406 are connected to a scan clock terminal CLK that supplies a clock used for scan test operation.

Next, there will be described the operation of the test circuit 1 with reference to FIG. 3. If another test, such as a scan test, is to be carried out while the semiconductor device is operating as usually, the test circuit 1 must be invalidated. And to invalidate the test circuit 1, a LOW signal is inputted to the test mode control terminal TM1 to turn on the transfer gate switch TG and connect the nodes N1 and N2 to each other electrically. In this case, as shown in the truth table of FIG. 5, a HIGH signal is inputted to the test decoder output signal node TDN1 and a LOW signal is inputted to the test decoder output signal node TDN2. Thus the first and second transistors T1 and T2 are kept off regardless of the control signal of the test mode control terminal TM2. Consequently, while only the electrical connection between the nodes N1 and N2 is kept, the test circuit 1 connected between the combinational circuits 31 and 32 is invalidated.

To carry out a burn-in or leak test is to be carried out for the semiconductor device, the test circuit 1 must be validated. And to validate the test circuit 1, a HIGH signal is inputted to the test mode control terminal TM1 to turn off the transfer gate switch TG and disconnect the nodes N1 and N2 from each other electrically. Thus the combinational circuits 31 and 32 are disconnected from each other, thereby the test circuit 1 is validated.

To apply a HIGH level stress to the node N2, a LOW signal is inputted to the test mode control terminal TM2. In this case, as shown in the truth table of FIG. 5, a LOW signal is inputted to the first transistor T1 through the test decoder output signal node TDN1 to turn on the first transistor T1, thereby the node N2 and the power supply VDD are connected to each other. On the other hand, a LOW signal is inputted to the second transistor T2 through the test decoder output signal node TDN2 to turn off the second transistor T2, thereby the node N2 is disconnected electrically from the ground GND. Consequently, because the transfer gate switch TG is off at this time, no through-current flows between the node N1 and the power supply VDD through the first transistor T1 even when the signal state of the node N1 is unstable or on the LOW level. And because the second transistor T2 is also off at this time, no through-current flows between the node N2 and the ground GND through the second transistor T2. This is why a HIGH level stress can be applied only to the node N2.

To apply a LOW level stress to the node N2, a HIGH signal is inputted to the test mode control terminal TM2. At this time, as shown in the truth table of FIG. 5, a HIGH signal is inputted to the first transistor T1 through the test decoder output signal node TDN1 to turn off the first transistor T1 and disconnect the node N2 from the power supply VDD. On the other hand, a HIGH signal is inputted to the second transistor T2 through the test decoder output signal node TDN2 to turn on the second transistor T2 and connect the node N2 to the ground GND. Consequently, because the transfer gate switch TG is off at this time, no through-current flows between the node N1 and the ground GND through the second transistor T2 even when the signal state of the node N1 is unstable or on the HIGH level. And because the first transistor T1 is also off at this time, no through-current flows between the node N2 and the power supply VDD through the first transistor T1. This is why a LOW level stress can be applied only to the node N2.

This means that the node N2 can be set to any of the power supply level and the ground level while the test circuit 1 is validated. Therefore, if a proper signal is inputted to the test mode control terminals TM1 and TM2 respectively, the integrated time of stress application to the node N2 can be equalized between the power supply level and the ground level.

If the test circuit 1 is already invalidated at this time, the first and second transistors T1 and T2 are kept off. Thus no through-current flows through the transfer gate switch TG. Furthermore, because the transfer gate switch TG is kept off at this time even when the test circuit is validated, no through-current flows through the transfer gate switch TG. This means that controlling the first and second transistors T1 and T2 can be linked with controlling the transfer gate switch TG to surely prevent the through-current from flowing through the transfer gate switch TG.

Figure 1:
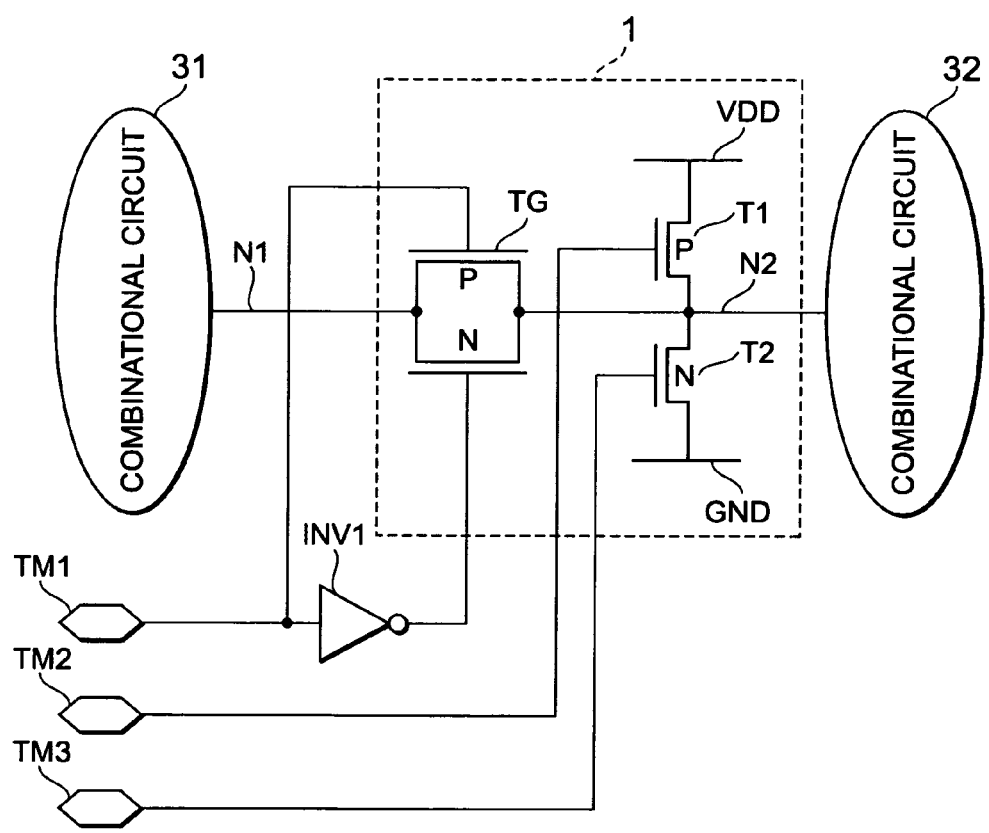
FIG. 1 is a block diagram for describing configurations of a test circuit and its peripheral circuits in the first embodiment of the present invention.

On the other hand, in FIG. 1, the operation of the transfer gate switch TG is independent of the operations of the first and second transistors T1 and T2. Consequently, a through-current might flow through the transfer gate switch TG, although it depends on the input timing of the signals to the test mode control terminal TM1 to 3. According to this second embodiment of the present invention, however, such a through-current flow through the transfer gate switch TG can be prevented surely. Thus the advantage of this second embodiment is more than that of the first embodiment of the present invention.

In this case, the leak test can also be made just like in the first embodiment.

Next, there will be described the circuit operation of the semiconductor device shown in FIG. 6. If another test, such as a scan test, is to be carried out while the semiconductor is operating as usually, the test circuits 11 to 13 must be invalidated by the method described above. With this invalidation, the test circuits 11 to 13 come to be prevented completely from affecting the regular operation or the scan test operation of the semiconductor device.

In case of the semiconductor device shown in FIG. 6, just like the semiconductor device shown in FIG. 1, there are some nodes in which no stress levels can be set. This operation principle is the same as that shown in FIG. 1, so that its description will be omitted here.

In spite of this, it becomes possible to apply a HIGH or LOW level stress even to such nodes in which no stress levels cannot be set if the test circuits 11 to 13 are invalidated by the method described above and control signals are inputted to the test mode control terminal TM2. Consequently, this second embodiment can also be assured to obtain the same effects as those in the first embodiment.

Furthermore, according to the configuration of the semiconductor device in this second embodiment, because a test decoder TD is used, the test mode control terminal TM3, which is used in the first embodiment, can be eliminated. The burn-in or leak test can thus be carried out more easily and more ideally.

Third Embodiment

In this third embodiment of the present invention, the test mode control terminal TM2 used in the second embodiment is replaced with a scan clock terminal CLK.

Figure 7:
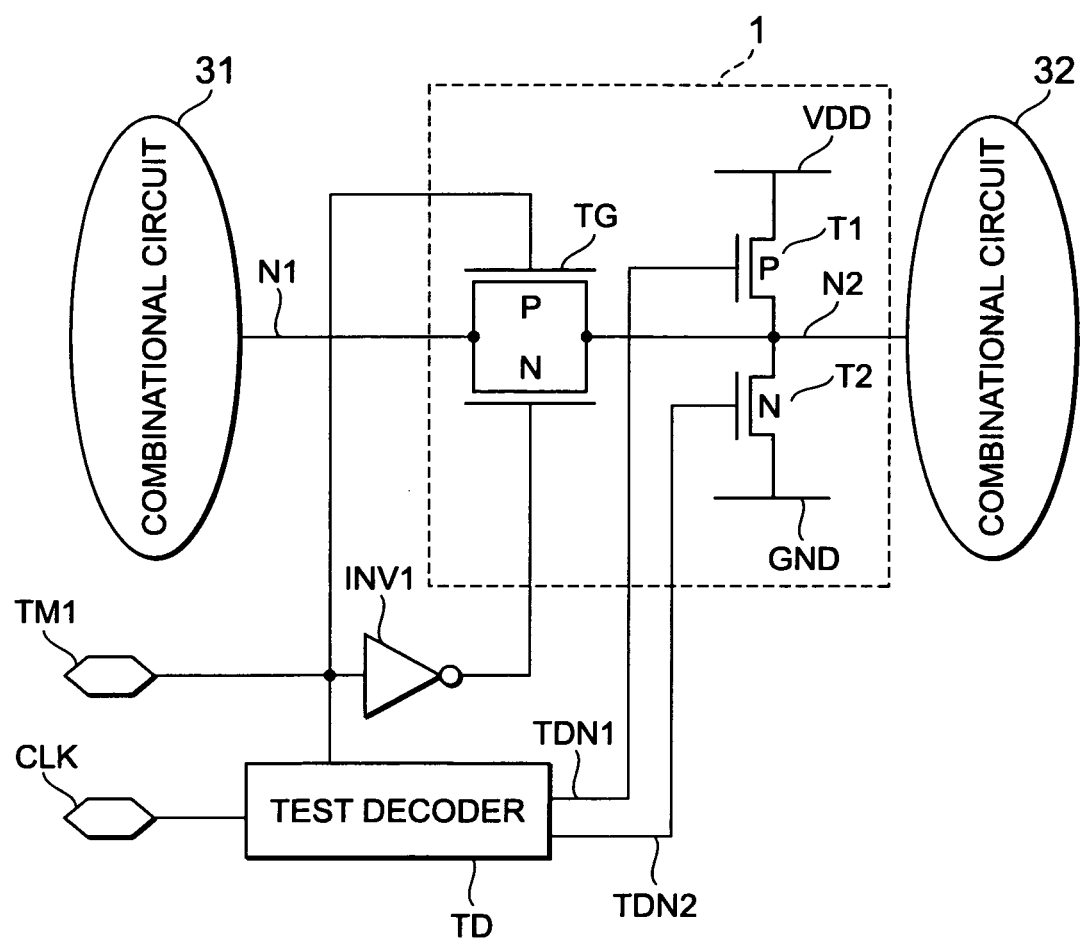
FIG. 7 is a block diagram of configurations of a test circuit and its peripheral circuits in the third embodiment of the present invention.

At first, there will be described a configuration of a test circuit 1 and configuration of its peripheral circuits with reference to the block diagram shown in FIG. 7. In FIG. 7, the test mode control terminal TM2 shown in FIG. 3 is replaced with a scan clock terminal CLK as described above. Other components are the same as those shown in FIG. 3, so that the description for them will be omitted here.

Figures 8, 9:
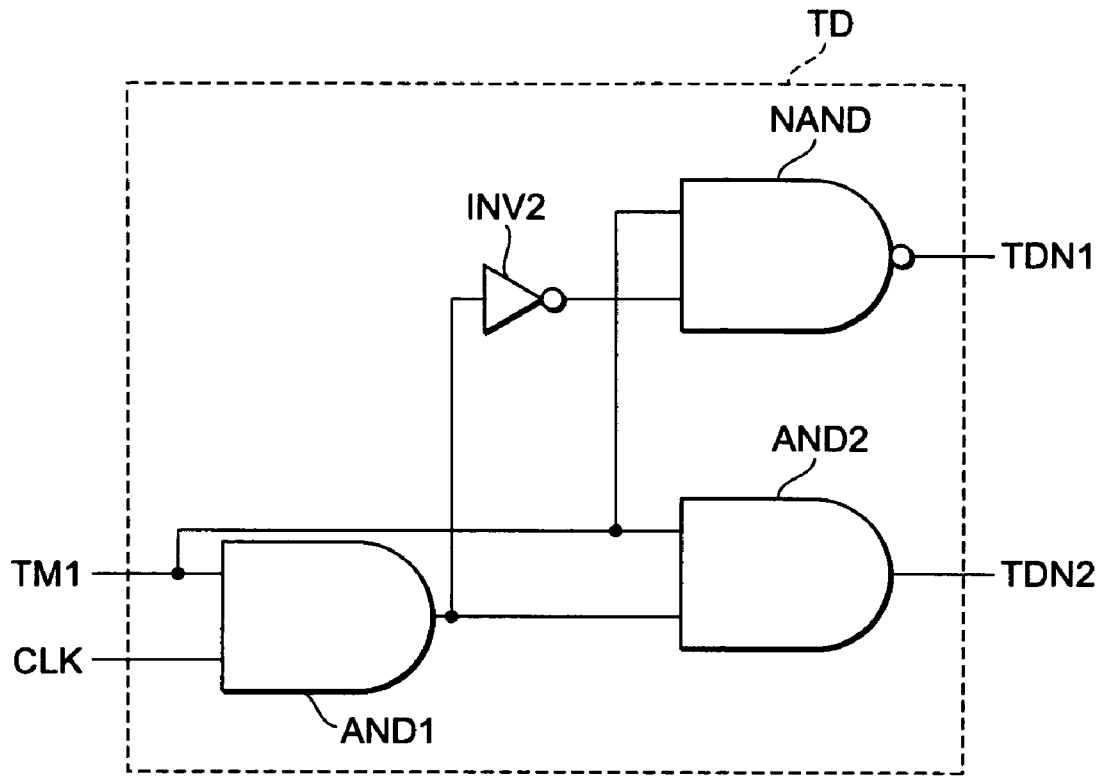
FIG. 8 is a block diagram of a configuration of a test decoder in the third embodiment of the present invention.
FIG. 9 is a truth table of the test decoder in the third embodiment of the present invention.

Also in the test decoder TD shown in FIG. 8, the test mode control terminal TM2 shown in FIG. 4 is replaced with a scan clock terminal CLK. Other parts are the same as those shown in FIG. 4, so that the description for them will be omitted here.

Next, there will be described a configuration of a test circuit 1 that includes a built-in test circuit 1 with reference to the clock diagram shown in FIG. 10. In the test decoder TD shown in FIG. 10, the test mode control terminal TM2 shown in FIG. 6 is replaced with a scan clock terminal CLK as described above. Other parts are the same as those shown in FIG. 6, so that the description for them will be omitted here.

Next, there will be described the operation of the test circuit 1 with reference to FIG. 7. If another test, such as a scan test, is to be carried out while the semiconductor is operating as usually, the test circuit 1 must be invalidated just like in the second embodiment. As a result, the first and second transistors T1 and T2 come to be kept off.

To carry out a burn-in or leak test for the semiconductor device, the test circuit 1 must be validated. And just like in the second embodiment, to validate the test circuit 1, a HIGH signal is inputted to the test mode control terminal TM1.

In this case, the first and second transistors T1 and T2 input the same signal as the scan clock signal supplied to the test decoder TD as shown in the truth table of FIG. 9.

While the level of the scan clock signal is LOW, the first transistor T1 inputs a LOW signal through the test decoder output signal node TDN1, thereby the first transistor T1 is turned on to connect the node N2 and the power supply VDD to each other. On the other hand, the second transistor T2 inputs a LOW signal through the test decoder output signal TDN2, thereby the second transistor T2 is turned off to disconnect the node N2 from the ground GND electrically.

Consequently, because the transfer gate switch TG is off at this time, no through-current flows between the node N1 and the power supply VDD through the first transistor T1 even when the signal state of the node N1 is unstable or on the LOW level. Furthermore, no through-current flows between the node N2 and the ground GND through the second transistor T2. This is why a HIGH level stress can be applied only to the node N2.

While the level of the scan clock signal is HIGH, the first transistor T1 inputs a HIGH signal through the test decoder output signal node TDN1, thereby the first transistor T1 is turned off to disconnect the node N2 and the power supply VDD from each other. On the other hand, the second transistor T2 inputs a HIGH signal through the test decoder output signal node TDN2, thereby the second transistor T2 is turned on to connect the node N2 to the ground GND electrically. Consequently, because the transfer gate switch TG is off at this time, no through-current flows between the node N1 and the ground GND through the second transistor T2 even when the signal state of the node N1 is unstable or on the HIGH level. Furthermore, because the first transistor T1 is also off at this time, no through-current flows between the node N2 and the power supply VDD through the first transistor T1. This is why a LOW level stress can be applied only to the node N2.

This means that the node N2 can be set to any of the power supply level and the ground level evenly in integrated time.

Next, there will be described the circuit operation of the semiconductor device shown in FIG. 10. In FIG. 10, the control signal supplied through the test mode control terminal TM2 shown in FIG. 6 is replaced with the scan clock signal.

Figure 10:
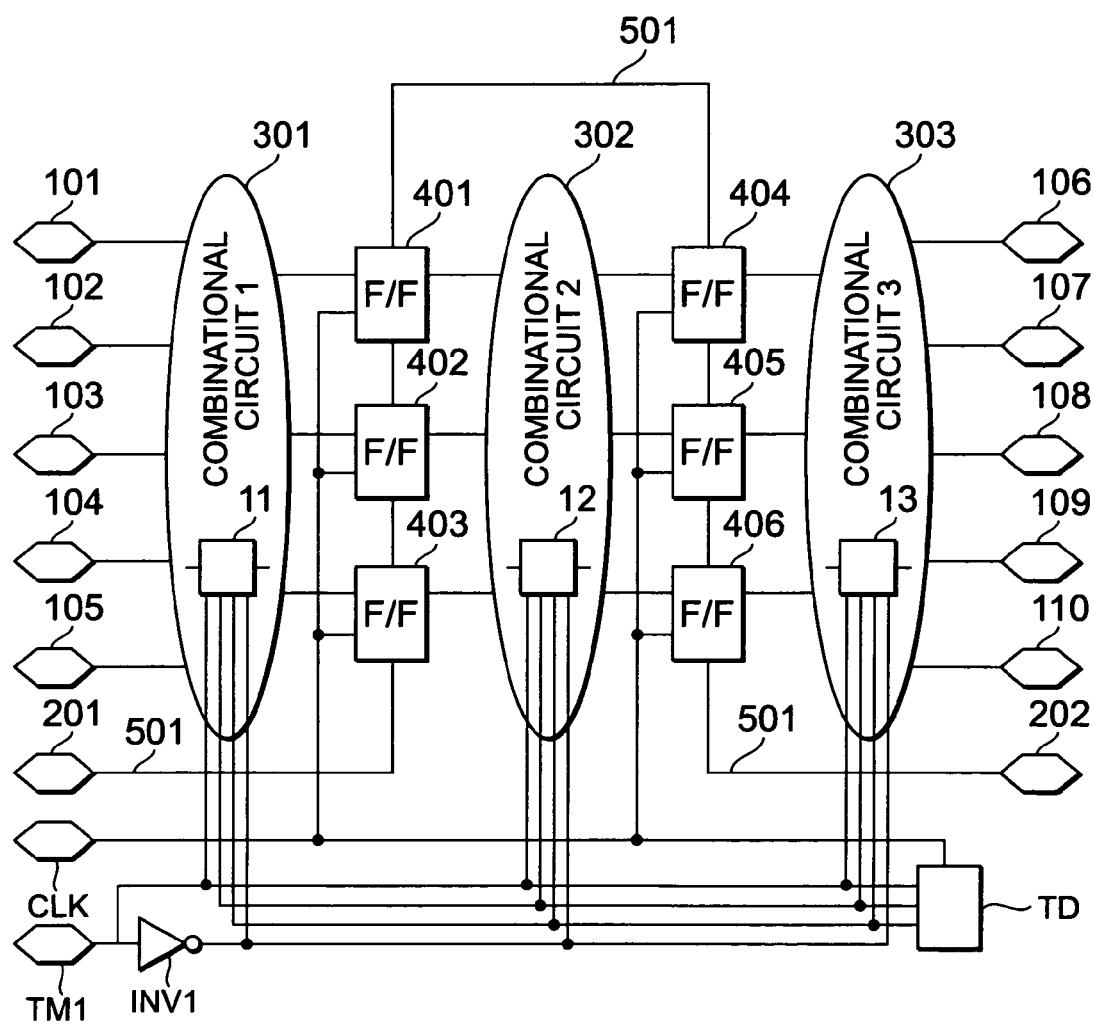
FIG. 10 is a block diagram of a semiconductor device that includes the test circuit in the third embodiment of the present invention.

Other operation principles are the same between FIG. 10 and FIG. 6, so that the description for them will be omitted here.

Consequently, because the test decoder TD inputs the scan clock signal at this time, this third embodiment can obtain the same effects as those in the second embodiment. Furthermore, the scan clock signal is supplied alternately and evenly between the HIGH and LOW levels. Thus no adjustment is required to equalize the integrated time of stress application between the power supply level and the ground level of the test mode control signal. Without such adjustments, the integrated time of stress application can be equalized automatically between those two levels in this third embodiment. This is why the burn-in or leak test can be carried out more easily and more ideally in this third embodiment.

Fourth Embodiment

At first, there will be described a configuration of a test circuit 2 and configurations of its peripheral circuits in this fourth embodiment of the present invention with reference to the block diagram shown in FIG. 11. The test circuit 2 includes a transfer gate switch TG consisting of a PMOS transistor and an NMOS transistor. The test circuit also includes a first transistor T1 and a second transistor T2 that are PMOS transistors connected to each other serially between a power supply VDD and a node N2. The test circuit 2 further includes a third transistor T3 and a fourth transistor T4 that are NMOS transistors connected to each other serially between a ground GND and a node N2.

A node N1 connected to a combinational circuit 31 and another node N2 connected to another combinational circuit 32 are connected to each other through a transfer gate switch TG. And a test mode control terminal TM1 is connected to the PMOS transistor of the transfer gate switch TG and the fourth transistor T4 respectively so as to have a positive logic while the test mode control terminal TM1 is connected to the NMOS transistor of the transfer gate switch TG and the first transistor T1 respectively so as to have an inverted logic generated by the inverter logic block INV1. The test mode control terminal TM2 is connected to the second transistor T2 and the third transistor T3 respectively.

Figure 12:
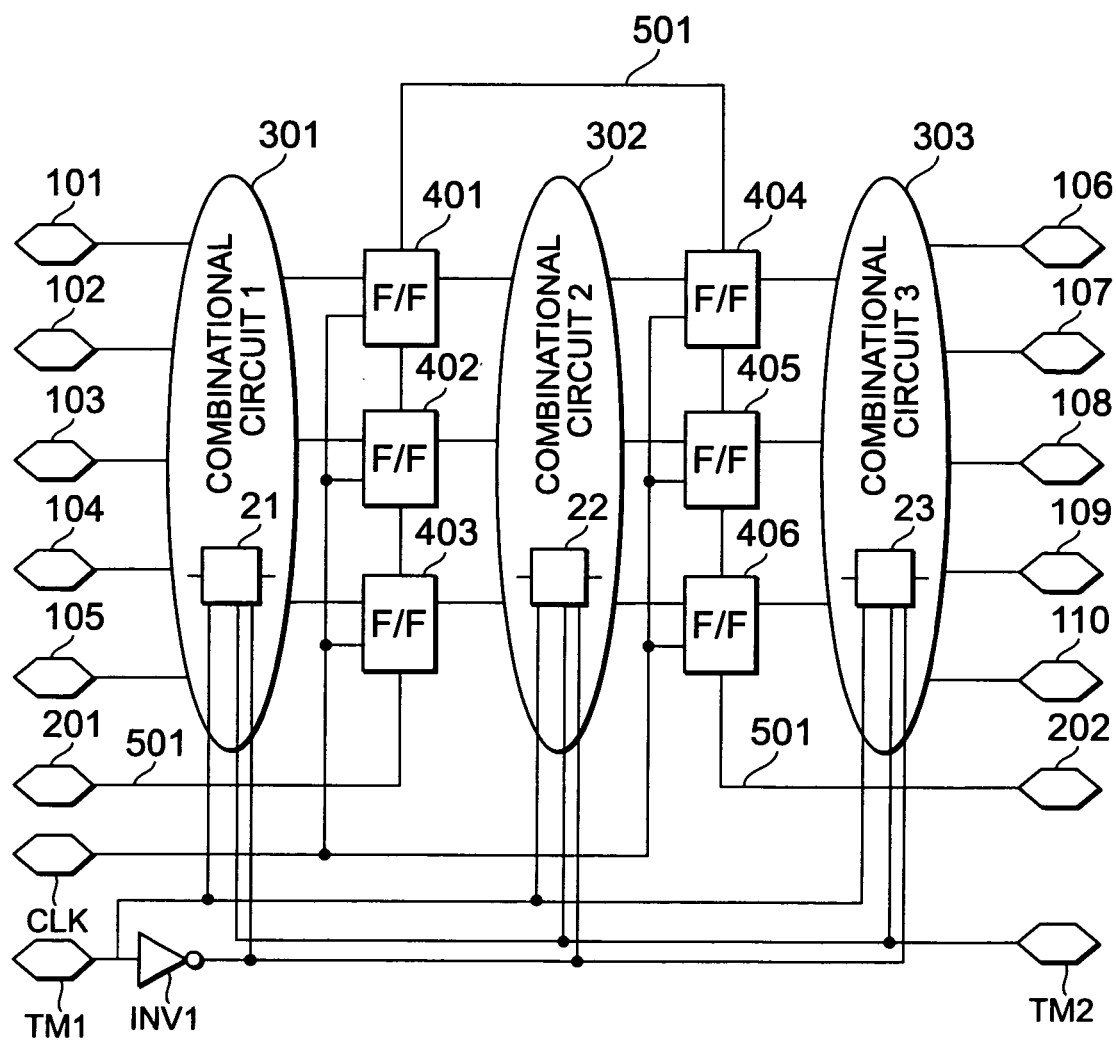
FIG. 12 is a block diagram of a semiconductor device that includes the test circuit in the fourth embodiment of the present invention.

Next, there will be described a configuration of a semiconductor device that includes a built-in test circuit 2 with reference to the block diagram shown in FIG. 12. In this semiconductor device, as shown in FIG. 12, combinational circuits 301 to 303, flip-flop circuits 401 to 406, and external terminals 101 to 110 of the semiconductor device are connected to each another. The combinational circuits 301 to 303 include built-in test circuits 21 to 23 having the same configuration as that of the test circuit 1. The test mode control terminals TM1 and TM2 connected to the test circuits 21 to 23 and the inverter logic block INV1 connected to the test mode control terminal TM1 is grouped into one set so as to be prepared for the semiconductor device and the same control signals are used commonly by those circuits.

Furthermore, the flip-flop circuits 401 to 406, the scan data input terminal 201, and the scan data output terminal 202 are connected to each another through a scan test path 501. The flip-flop circuits 401 to 404 are connected to a scan clock terminal CLK that supplies a clock for scan test operations.

Next, there will be described the operation of the test circuit 2 with reference to FIG. 11. While the semiconductor device is operating as usually, if another test, such as a scan test, is to be carried out, the test circuit 1 must be invalidated. And to invalidate the test circuit 1, a LOW signal is inputted to the test mode control terminal TM1 to turn on the transfer gate switch TG and connect the nodes N1 and N2 electrically to each other. At this time, a LOW signal is inputted to the fourth transistor T4 connected to the test mode control terminal TM1 so as to have a positive logic. Consequently, the fourth transistor T4 is turned off, thereby the node N2 is disconnected electrically from the ground GND. On the other hand, a HIGH signal is inputted to the first transistor T1 connected to the test mode control terminal TM1 so as to have an inverted logic. Consequently, the first transistor T1 is turned off to disconnect the node N2 from the power supply VDD. And only the electrical connection between the nodes N1 and N2 is kept at this time, thereby the test circuit 1 connected between the combinational circuits 31 and 32 is invalidated.

To carry out a burn-in or leak test for the semiconductor device, the test circuit 1 must be validated. And to validate the test circuit 1, a HIGH signal is inputted to the test mode control terminal TM1 to turn off the transfer gate switch TG and disconnect the nodes N1 and N2 from each other. Consequently, the combinational circuits 31 and 32 are disconnected from each other, thereby the test circuit 1 is validated. At this time, the fourth transistor T4 connected to the test mode control terminal TM1 so as to have a positive logic inputs a HIGH signal, thereby the fourth transistor T4 is turned on.

On the other hand, the first transistor T1 connected to the test mode control terminal TM1 so as to have an inverted logic inputs a LOW signal, thereby the first transistor T1 is turned on. Consequently, when the test mode control terminal TM2 inputs a signal, the second and third transistors T2 and T3 are activated; thereby, it becomes possible to control the stress application level for the node N2.

To apply a HIGH level stress to the node N2, a LOW signal is inputted to the test mode control terminal TM2 to turn on the second transistor T2 and turn off the third transistor T3. Consequently, the node N2 is connected to the power supply VDD and the node N2 is disconnected from the ground GND. As a result, because the transfer gate switch TG is off at this time, no through-current flows between the node N1 and the power supply VDD through the first and second transistors T1 and T2 even when the signal state of the node N1 is unstable or on the LOW level. Furthermore, because the third transistor T3 is off while the fourth transistor T4 is on at this time, no through-current flows between the node N2 and the ground GND. This is why a HIGH level stress can be applied only to the node N2.

To apply a LOW level stress to the node N2, a HIGH signal is inputted to the test mode control terminal TM2 to turn off the second transistor T2 and turn on the third transistor T3. As a result, the node N2 is disconnected form the power supply VDD and the node 2 is connected to the ground GND electrically. Consequently, because the transfer gate switch TG is off at this time, no through-current flows between the node N1 and the ground GND through the third and fourth transistors T3 and T4 even when the signal state of the node N1 is unstable or on the HIGH level. And because the first transistor T1 is on and the second transistor T2 is off at this time, no through-current flows between the node N2 and the power supply VDD. This is why a LOW level stress can be applied only to the node N2.

In other words, if the test circuit 1 is validated, the node N2 can be set to any of the power supply level and the ground level. This is why the burn-in or leak test can be carried out in this fourth embodiment just like in the first embodiment.

Furthermore, if the test circuit 2 is invalidated, the first and fourth transistors T1 and T4 are kept off. Thus no through-current flows through the transfer gate switch TG. Even when the test circuit 2 is validated, because the transfer gate switch TG is kept off at this time, no through-current flows through the transfer gate switch TG. In other words, controlling of the first and fourth transistors T1 and T4 can be linked with controlling of the transfer gate switch TG so as to surely prevent the through-current from flowing through the transfer gate switch TG. Therefore, this fourth embodiment can also obtain the same effects as those of the second embodiment.

Next, there will be described the circuit operation of the test circuit shown in FIG. 12. While the semiconductor device is operating as usually, if another test, such as a scan test, is to be carried out, the test circuits 21 to 23 must be invalidated by the method described above. With this invalidation, the test circuits 21 to 23 come to be prevented completely from affecting the regular operations of the semiconductor device or scan test operations for the semiconductor device.

Just like in the semiconductor device shown in FIG. 1, also in case of the semiconductor device shown in FIG. 12, there are some nodes in which no stress levels can be set. This operation principle of the semiconductor device shown in FIG. 12 is the same as that of the semiconductor device shown in FIG. 1, so that its description will be omitted here.

If the test circuits 21 to 23 are validated just like in the above embodiments and a control signal is inputted to the test mode control terminal TM2, however, it becomes possible to apply a HIGH or LOW level stress even to those nodes in which no stress levels can be set.

By using the test circuit 2, therefore, it becomes possible to activate those nodes that are disabled for stress level setting. In addition, by controlling the test mode control terminals TM1 and TM2 so that the integrated time of stress application can be equalized between the HIGH and LOW levels, this fourth embodiment comes to obtain the same effects as those in the first embodiment.

In case of the semiconductor device that includes the test circuit 2 as shown in FIG. 12, the test decoder TD required for the semiconductor device shown in FIG. 6 can be omitted. Even so, the semiconductor device can obtain the same effects as those of the semiconductor device shown in FIG. 6. This is why the burn-in or leak test can be carried out more easily and more ideally in this fourth embodiment.

Fifth Embodiment

In this fifth embodiment, the test mode control terminal TM2 in the fourth embodiment is replaced with a scan clock terminal CLK.

Figure 13:
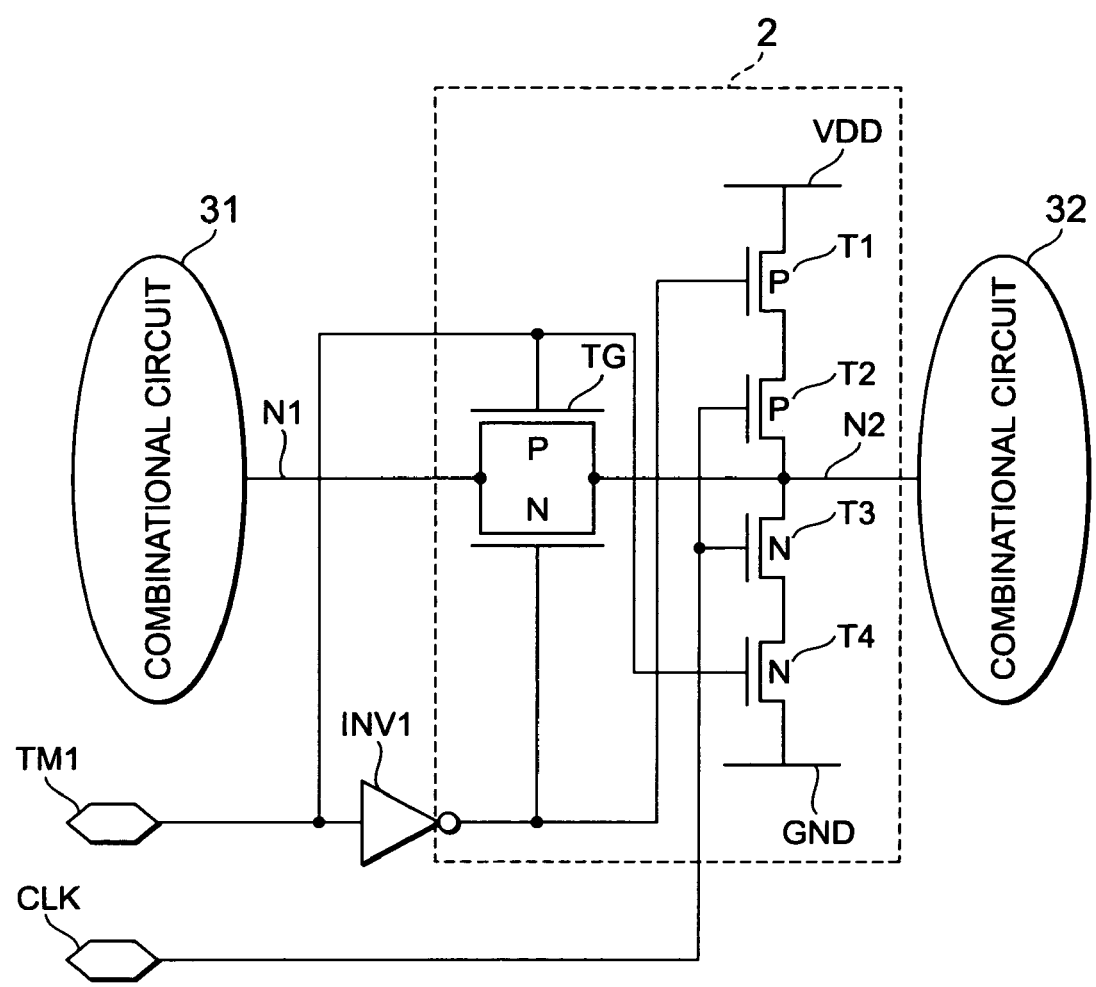
FIG. 13 is a block diagram of configurations of a test circuit and its peripheral circuits in the fifth embodiment of the present invention.

At first, there will be described a configuration of a test circuit 2 and configurations of its peripheral circuits in this fifth embodiment of the present invention with reference to FIG. 13. In FIG. 13, the test mode control terminal TM2 shown in FIG. 11 is replaced with a scan clock terminal CLK as described above. Other components are the same as those shown in FIG. 11, so that the description for them will be omitted here.

Figure 14:
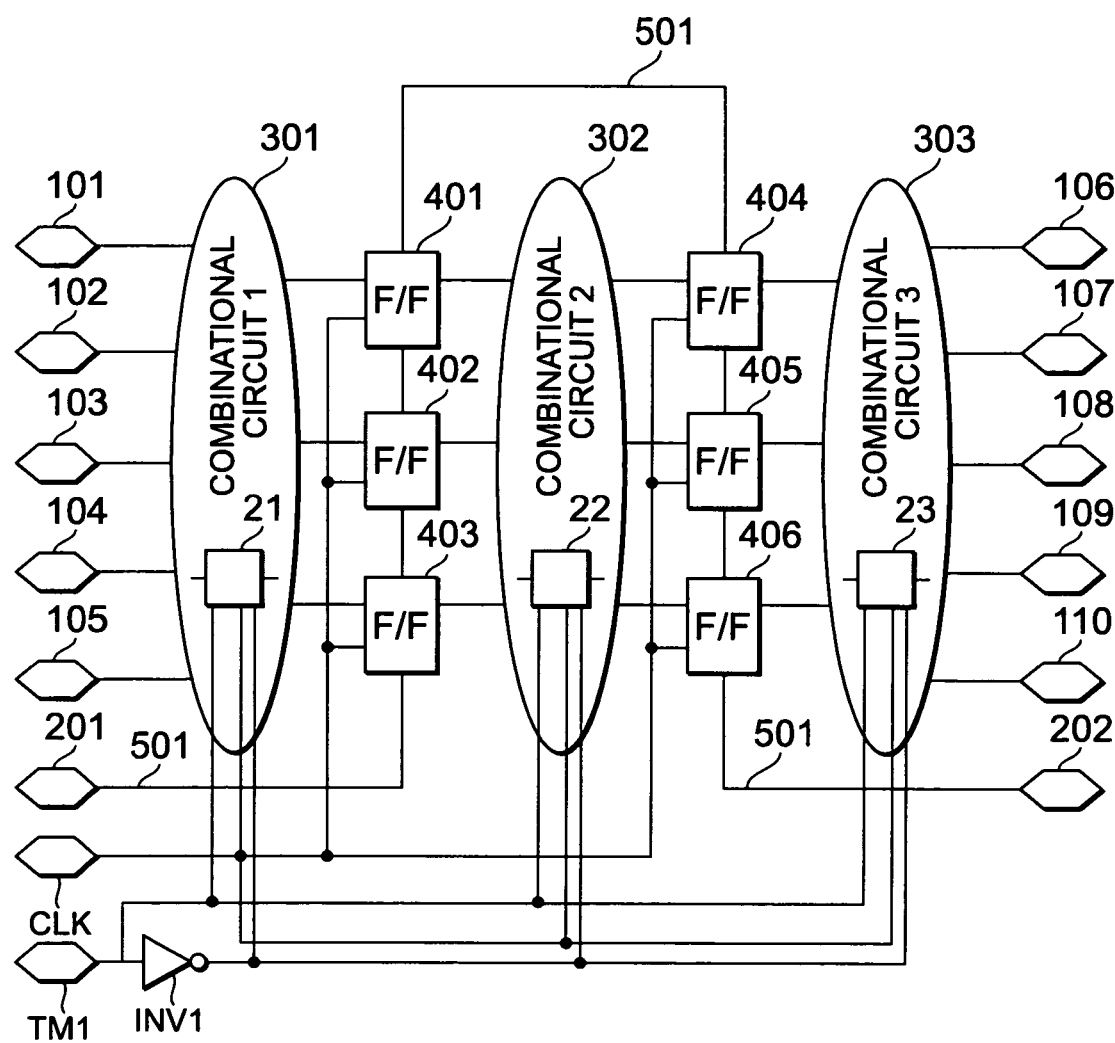
FIG. 14 is a block diagram of a semiconductor device that includes the test circuit in the fifth embodiment of the present invention.

Next, there will be described the configuration of the semiconductor device that includes a built-in test circuit 2 with reference to the block diagram shown in FIG. 14. In FIG. 14, the test circuits 21 to 23 are connected to the scan clock terminal CLK respectively, instead of the test mode control terminal TM2 shown in FIG. 6. Other components are the same as those shown in FIG. 12, so that the description for them will be omitted here.

Next, there will be described the operation of the test circuit 2 with reference to FIG. 13. While the semiconductor device is operating as usually, if another test, such as a scan test, is to be carried out, the test circuit 2 must be invalidated just like in the above fourth embodiment. Consequently, the first and fourth transistors T1 and T4 are also kept off in this case.

To carry out a burn-in or leak test for the semiconductor device, the test circuit 2 must be validated. And to validate the test circuit 2, a HIGH signal is inputted to the test mode control terminal TM1 just like in the fourth embodiment.

The second and third transistors T2 and T3 input a scan clock signal respectively. While the level of the scan clock signal is LOW, the second transistor T2 inputs a LOW signal, thereby the second transistor T2 is turned on and the node N2 is connected to the power supply VDD. On the other hand, the third transistor T3 inputs a LOW signal, thereby the third transistor T3 is turned off and the node N2 is disconnected from the ground GND. Consequently, because the transfer gate switch TG is off at this time, no through-current flows between the node N1 and the power supply VDD through the first and second transistors T1 and T2 even when the signal state of the node N1 is unstable or on the LOW level. Furthermore, while the fourth transistor T4 is on, the third transistor T3 is kept off. Thus no through-current flows between the node N2 and the ground GND. This is why a HIGH level stress can be applied only to the node N2.

While the level of the scan clock signal is HIGH, the second transistor T2 inputs a HIGH signal, thereby the second transistor T2 is turned off and the node N2 is disconnected from the power supply VDD. On the other hand, the third transistor T3 inputs a HIGH signal, thereby the third transistor T3 is turned on and the node N2 is connected to the ground GND. Consequently, because the transfer gate switch TG is off at this time, no through-current flows between the node N1 and the ground GND through the third and fourth transistors T3 and T4 even when the signal state of the node N1 is unstable or on the HIGH level. Furthermore, because the first transistor is on and the second transistor T2 is off at this time, no through-current flows between the node N2 and the power supply VDD. This is why a LOW level stress can be applied only to the node N2.

This means that the node N2 can be set to any of the power supply level and the ground level just like in the fourth embodiment.

Next, there will be described the circuit operation of the semiconductor device shown in FIG. 14. In this fifth embodiment of the present invention, the control signal supplied through the test mode control terminal TM2 shown in FIG. 12 is replaced with the scan clock signal. Other operation principles are the same as those in the above embodiment, so that the description for them will be omitted here.

Because the scan clock signal is inputted to the test circuit 2, this is why this fifth embodiment can obtain the same effects as those in the fourth embodiment. Furthermore, the level of the scan clock signal is alternated between HIGH and LOW so as to be supplied evenly. Consequently, without special adjustments, the integrated time of stress application can be equalized automatically between the power supply level and the ground level of the test mode control signal. As a result, the burn-in or leak test can be carried out more easily and more ideally in this fifth embodiment.

Sixth Embodiment

Here, there will be described how transistors and transfer gate switches used to configure the above test circuits 1 and 2 respectively can be built in a logic block of a combinational circuit. FIGS. 15 through 22 are block and circuit diagrams for describing how elements including CMOS (Complementary Metal Oxide Semiconductor) transistors are arranged in a matrix on a substrate. It is a general way to dispose CMOS transistors on a substrate in a matrix pattern. For example, FIG. 8 in the patent gazette JP-A-S56 (1981)-108242 shows such a conventional matrix structure. And FIGS. 15, 16, 19, and 20 show block and circuit diagrams for describing only the basic and simple layouts in the sixth embodiment of the present invention.

Figure 15:
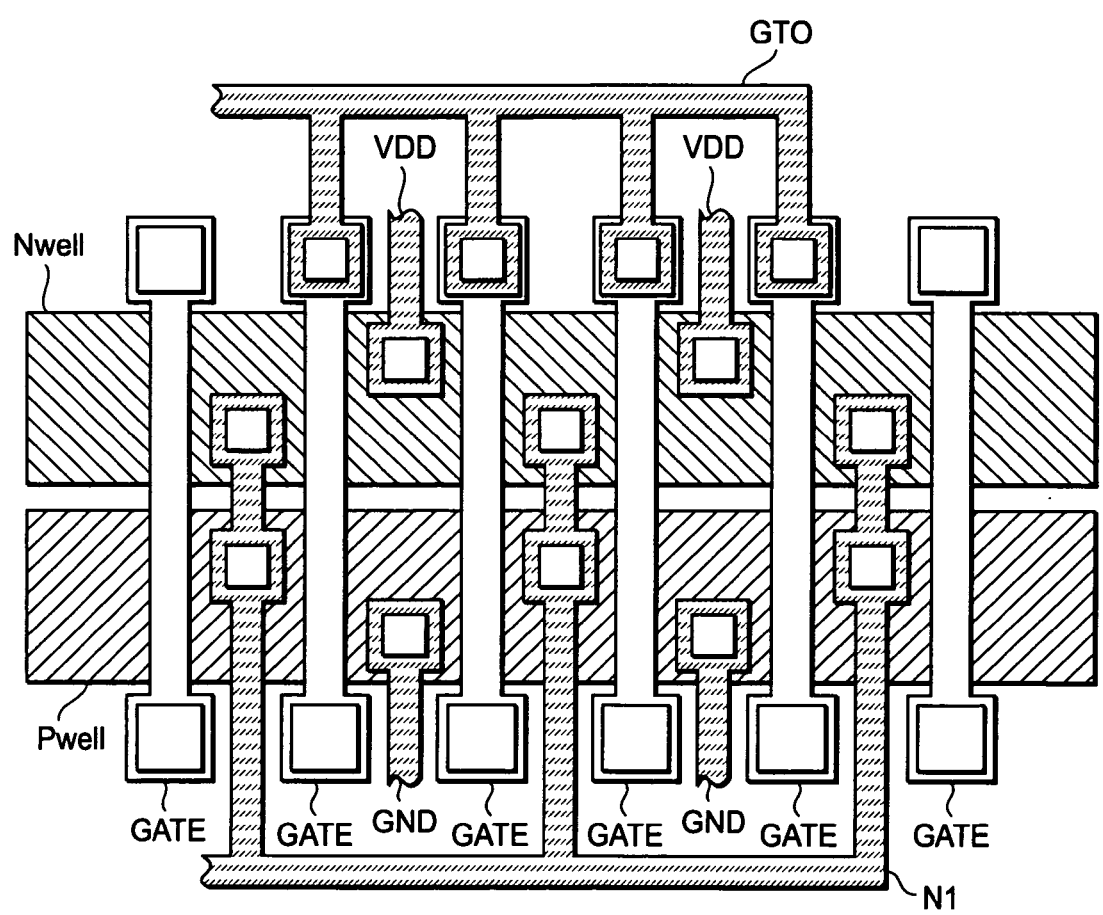
FIG. 15 is a layout diagram that includes the transistors in the sixth embodiment of the present invention.

At first, there will be described how PMOS and NMOS transistors used for a transfer gate switch of one test circuit of the present invention can be built in a logic block of a combinational circuit with reference to FIGS. 15 through 18. FIG. 15 is a general layout diagram of CMOS transistors. In the N-well region Nwell are formed PMOS transistors and in the P-well region Pwell are formed NMOS transistors. Those PMOS and NMOS transistors are arrayed through common gates GATE respectively. A power supply VDD is connected to the source of each PMOS transistor while a ground GND is connected to the drain of each NMOS transistor. Furthermore, the same signals are connected to the common gates GATE through a gate input path GT0 respectively. In this configuration, the node N1 is assumed as an output of the block.

Figure 17:
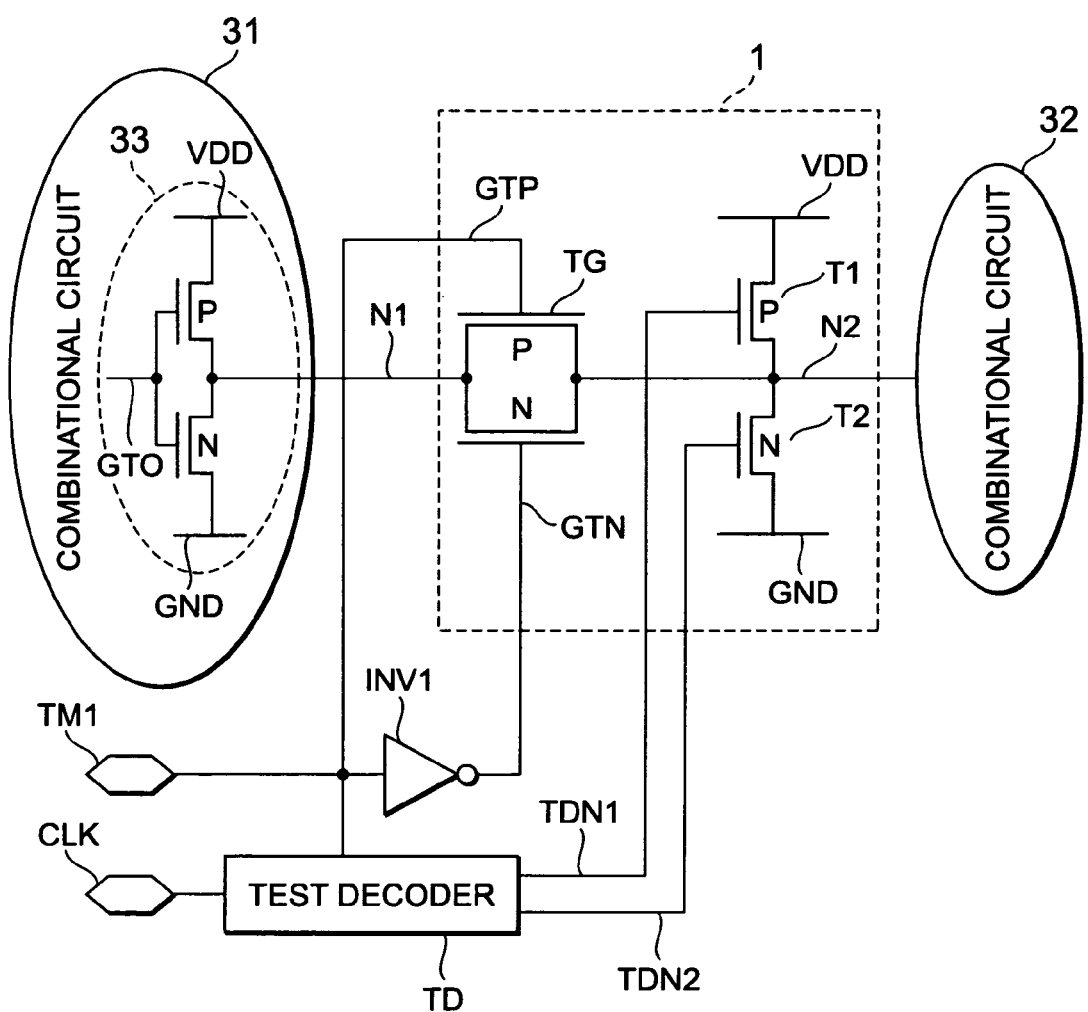
FIG. 17 is a block diagram of configurations of a test circuit and its peripheral circuits in the sixth embodiment of the present invention.

FIG. 17 is a block diagram that includes an output block 33 built in the combinational circuit 31 shown in FIG. 7 additionally. The output block 33 outputs a signal to the node N1 according to the input signal from the gate input signal path GT0. The output signal is a signal inverted from the input signal to the gate input signal path GT0 Each of the PMOS and NMOS transistors of the output block 33 consists of plural transistors connected to in parallel to the same node in its actual layout. In FIG. 17, they are grouped into one transistor.

Figure 18:
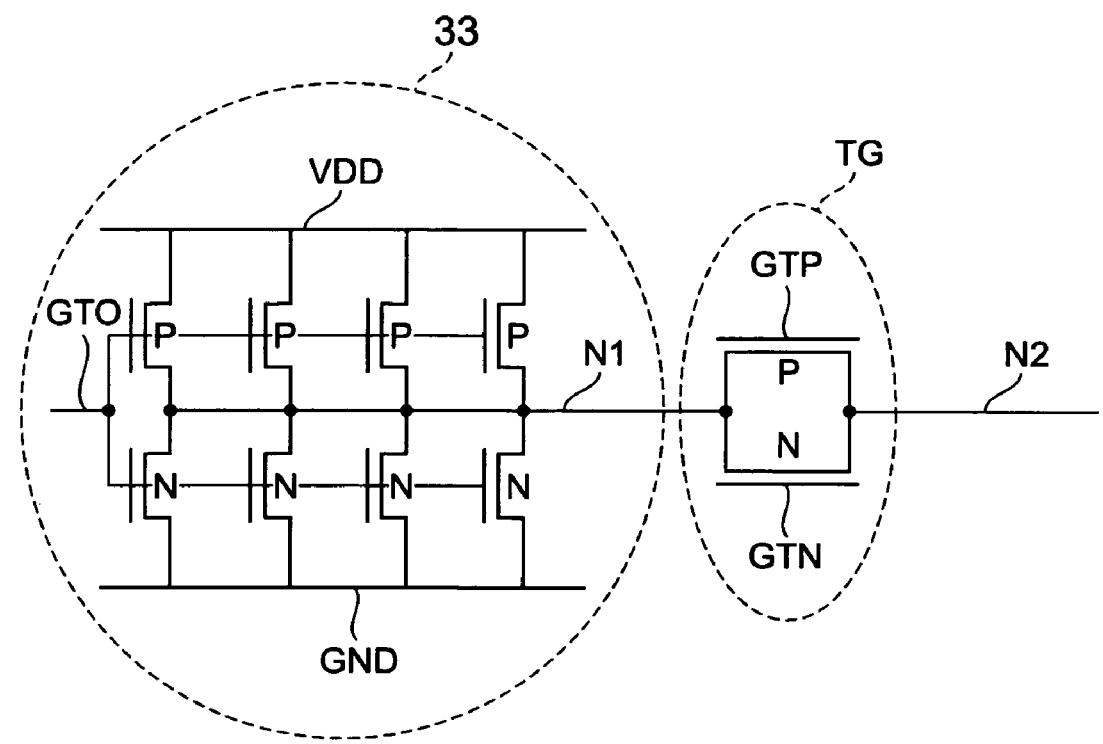
FIG. 18 is a circuit diagram that includes an output block and a transfer gate switch in the sixth embodiment of the present invention.

FIG. 18 is a circuit diagram that represents only the output block 33 and the transfer gate switch TG included in the test circuit 1. The block represented as one transistor in FIG. 17 actually consists of four PMOS transistors and four NMOS transistors that are connected in parallel. The gate input signal path GTP is connected to the gate of the PMOS transistor of the transfer gate switch TG. On the other hand, a gate input signal path GTN is connected to the gate of the NMOS transistor. The configuration of this output block 33 is equivalent to that shown in FIG. 15.

Figure 16:
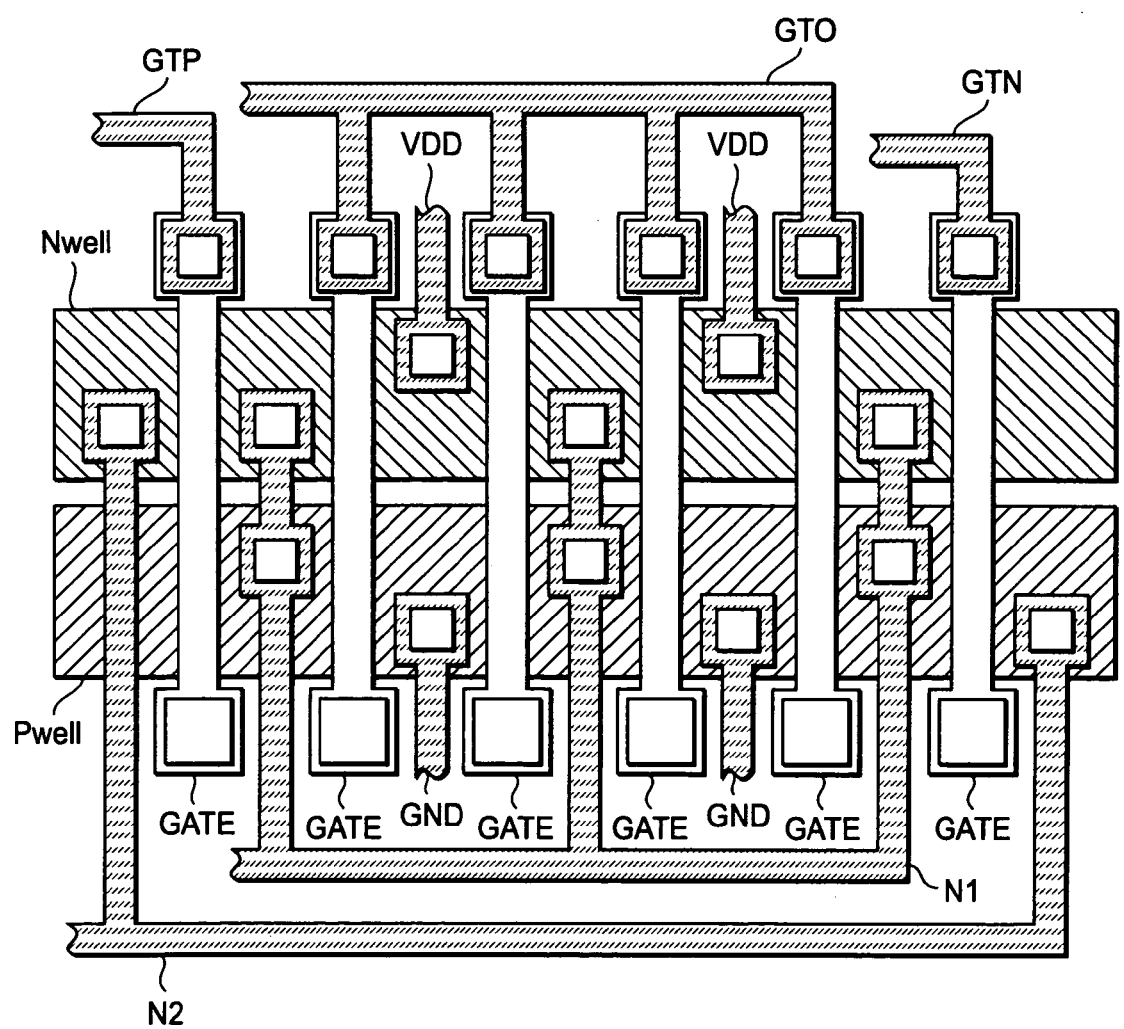
FIG. 16 is another layout diagram that includes the transistors in the sixth embodiment of the present invention.

FIG. 16 is a block diagram of a layout in which PMOS and NMOS transistors are added to the transfer gate switch TG by using the P-well region Pwell and the N-well region Nwell of the output block 33. The configuration shown in FIG. 16 is equivalent to the circuit diagram shown in FIG. 18. The node N2 is connected to the N-well region Nwell. And the node N2 combined with the gate GATE to which the gate input signal path GTP is connected so as to form a PMOS transistor of the transfer gate switch TG. Furthermore, the node N2 is connected to the P-well region Pwell and combined with the gate GATE to which the gate input signal path TGN is connected so as to form an NMOS transistor of the transfer gate switch TG. Consequently, because the P-well region Pwell and the N-well region Nwell of the output block 33 are used as are, the area overhead can be reduced more than in the case in which a P-well region Pwell and an N-well region Nwell are newly prepared for the transfer gate switch TG.

According to the configuration shown in FIG. 16, therefore, not only the transfer gate switch TG shown in FIG. 7, but also the transfer gate switch TG shown in any of FIGS. 1, 3, 11, and 13 can be built in a combinational circuit.

Figure 19:
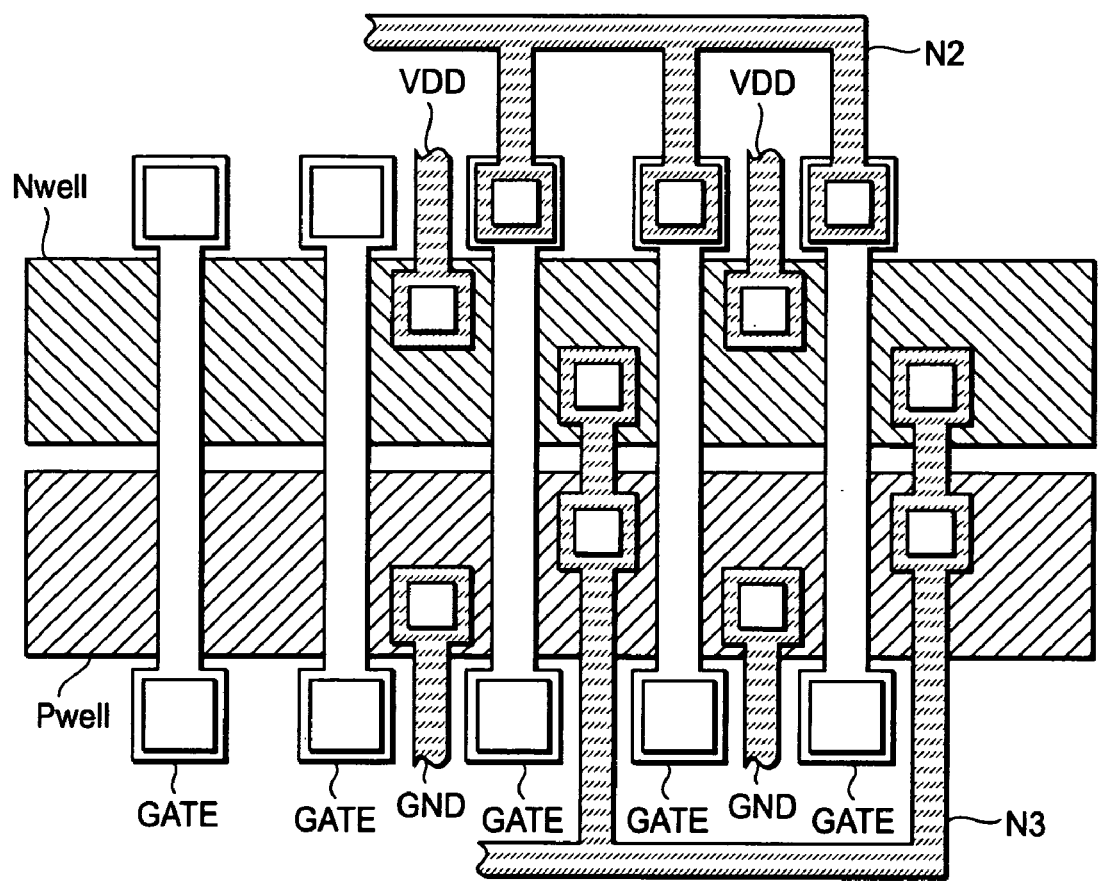
FIG. 19 is a layout diagram that includes the transistors in the sixth embodiment of the present invention.

Next, there will be described how the first to fourth transistors T1 to T4 connected serially as shown in FIG. 13 can be built in a logic block of a combinational circuit with reference to FIGS. 19 through 22. FIG. 19 is a block diagram of a general layout of a CMOS transistor. In the layout, PMOS transistors are formed in the N-well region Nwell and NMOS transistors are formed in the P-well region Pwell. Those PMOS and NMOS transistors are arrayed through common gates GATE respectively. A power supply VDD is connected to the source of each PMOS transistor and a ground GND is connected to the drain of each NMOS transistor. The same signals are connected to the common gates GATE through the node N2 respectively. The node N3 is used as the output of this configuration block.

Figure 21:
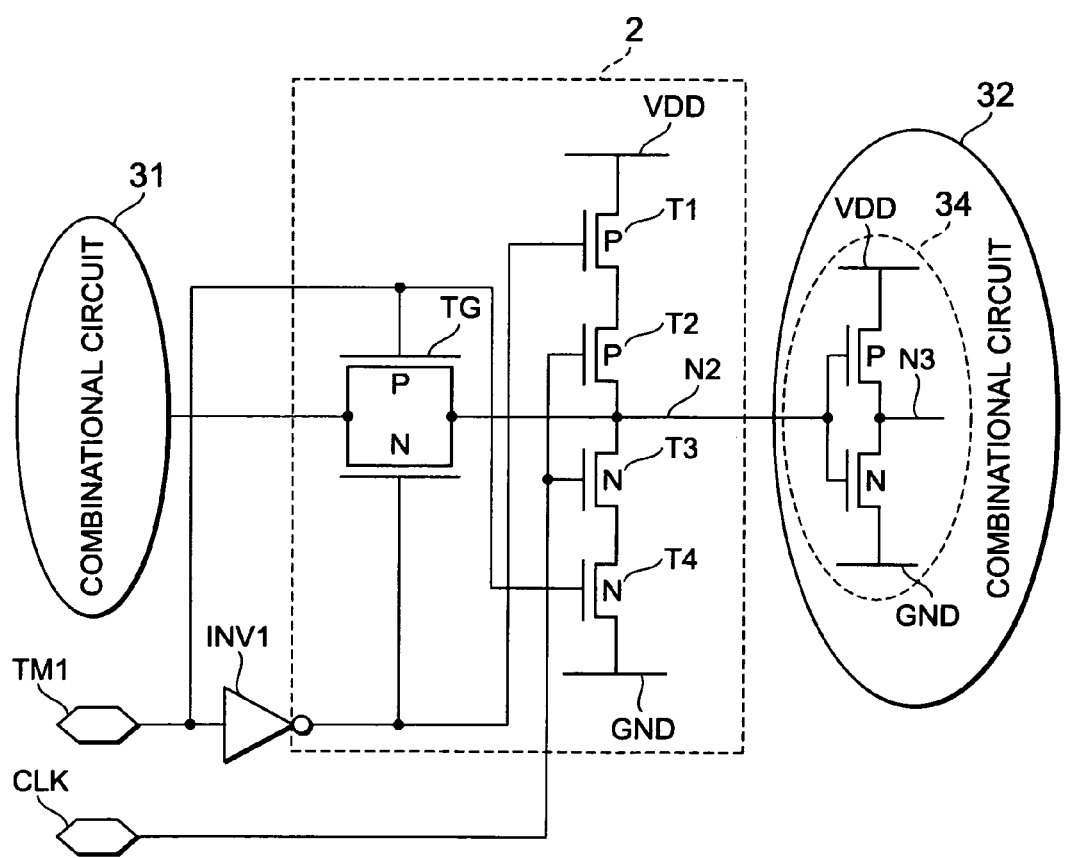
FIG. 21 is another block diagram of configurations of a test circuit and its peripheral circuits in the sixth embodiment of the present invention.

FIG. 21 is a circuit diagram that includes an input block 34 that is built in the combinational circuit 34 additionally to the configuration shown in FIG. 13. The input block 34 outputs a signal to the node N3. The output signal is a signal inverted from the signal received from the node N2. In the input block 34 in the actual layout are provided plural PMOS and plural NMOS transistors connected to the same node in parallel. In FIG. 21, those transistors are represented as one transistor collectively.

Figure 22:
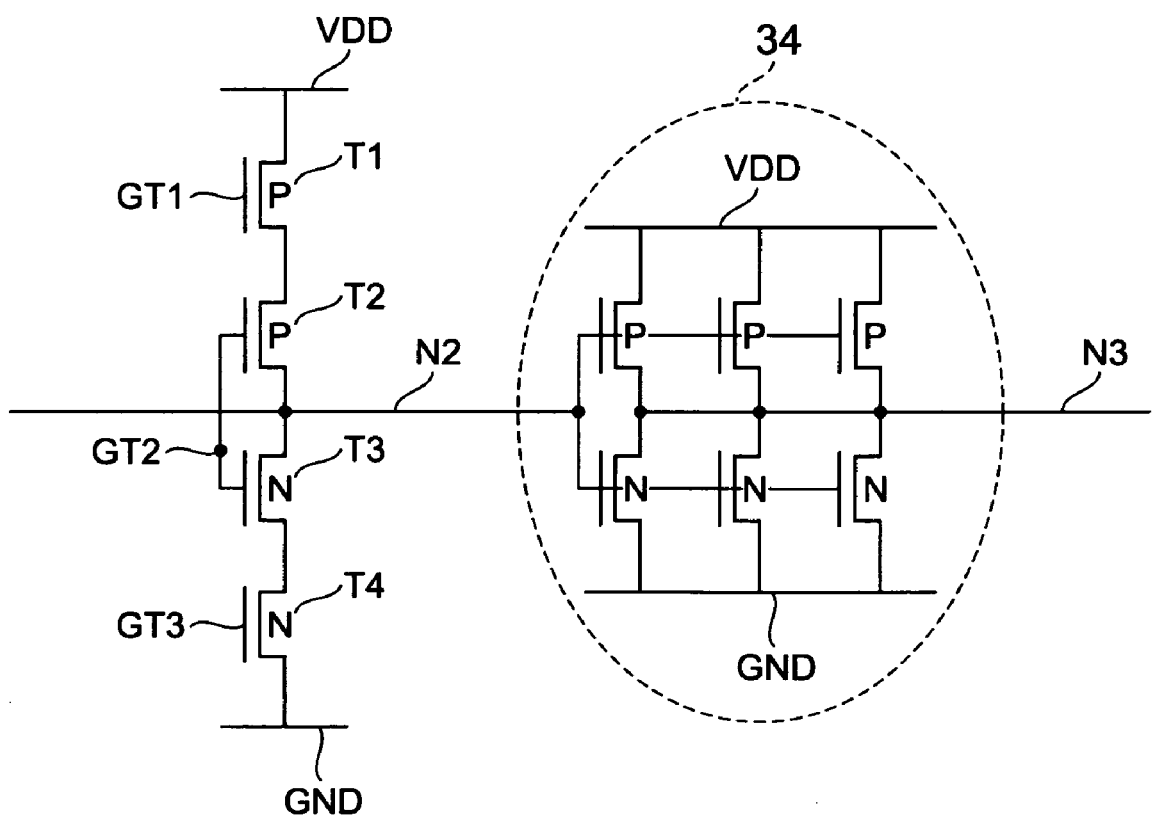
FIG. 22 is a circuit diagram that includes an input block and a transfer gate switch in the sixth embodiment of the present invention.
Figure 23:
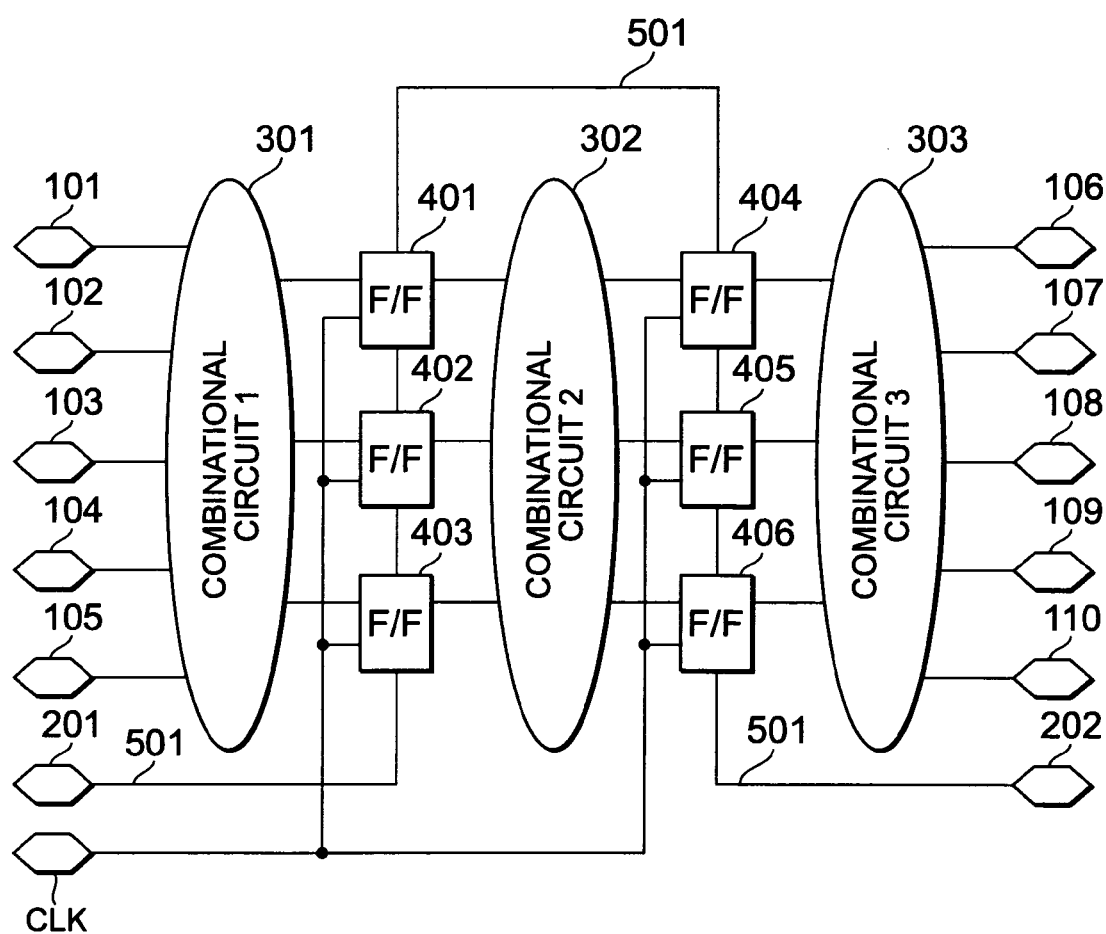
FIG. 23 is a block diagram of a configuration of an ordinary semiconductor device.

FIG. 22 is a circuit diagram that represents only the first to fourth transistors T1 to T4 included in the input block 34 and in the test circuit. In the input block 34, the section represented as one transistor in FIG. 21 is represented here as three PMOS transistors and three NMOS transistors connected in parallel respectively. The configuration of this input block 34 is equivalent to the configuration shown in FIG. 19.

Figure 20:
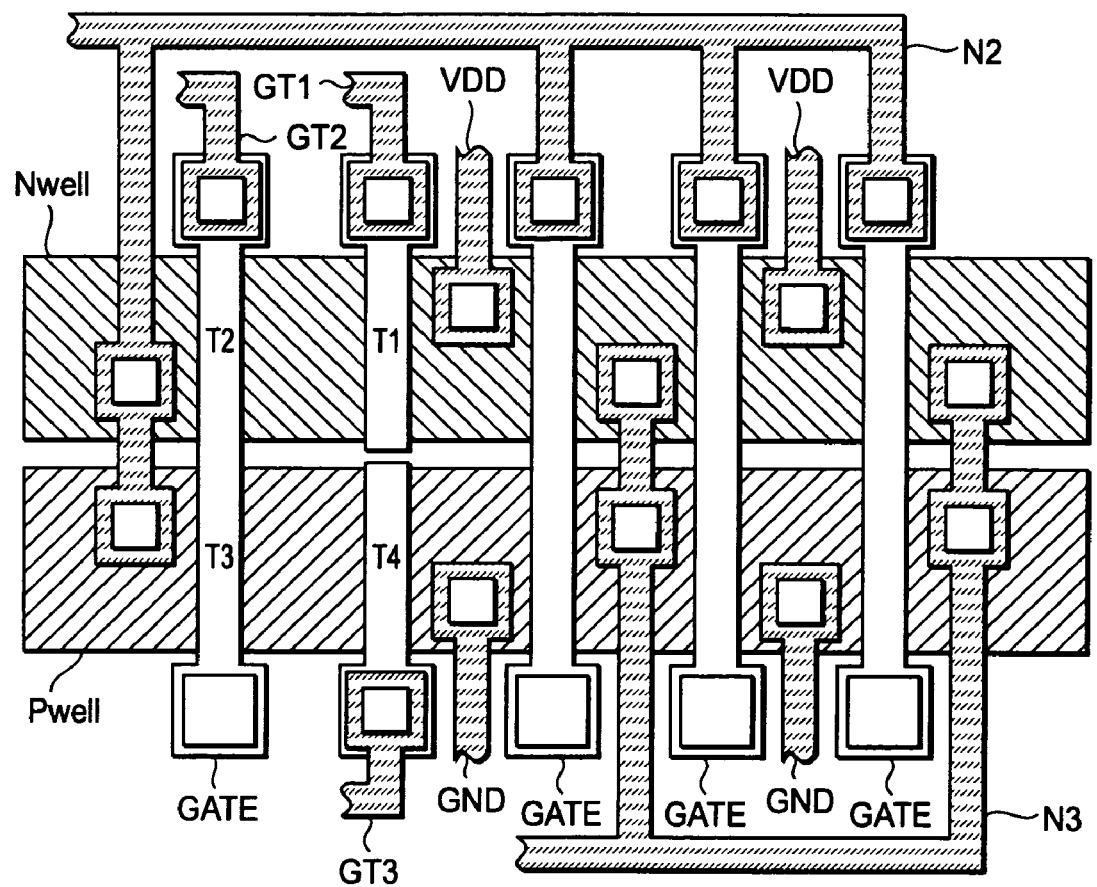
FIG. 20 is a layout diagram that includes the transistors in the sixth embodiment of the present invention.

FIG. 20 is a block diagram of a layout in which the first to fourth transistors T1 to T4 are added by using the P-well region Pwell and the N-well region Nwell of the input block 34. The configuration shown in FIG. 20 is equivalent to the circuit diagram shown in FIG. 22. In FIG. 20, the gate input signal path GT1 is connected to a gate GATE to form the first transistor T1. The gate input signal path GT2 is connected to another gate GATE to form the second and third transistors T2 and T3. And the gate input signal path GT3 is connected to still another gate GATE to form the fourth transistor T4. And in order to separate the first and fourth transistors T1 and T4 from each other, the gates of the first and fourth transistors T1 and T4 are separated from each other. The sources and drains of the second and third transistors T2 and T3 are connected to the node N2 respectively. And because the P-well region Pwell and the N-well region Nwell of the input block 34 are used as are, the area overhead can be reduced more than in the case in which another P-well region Pwell and another N-well region Nwell are prepared newly for the first and fourth transistors T1 to T4.

Figure 11:
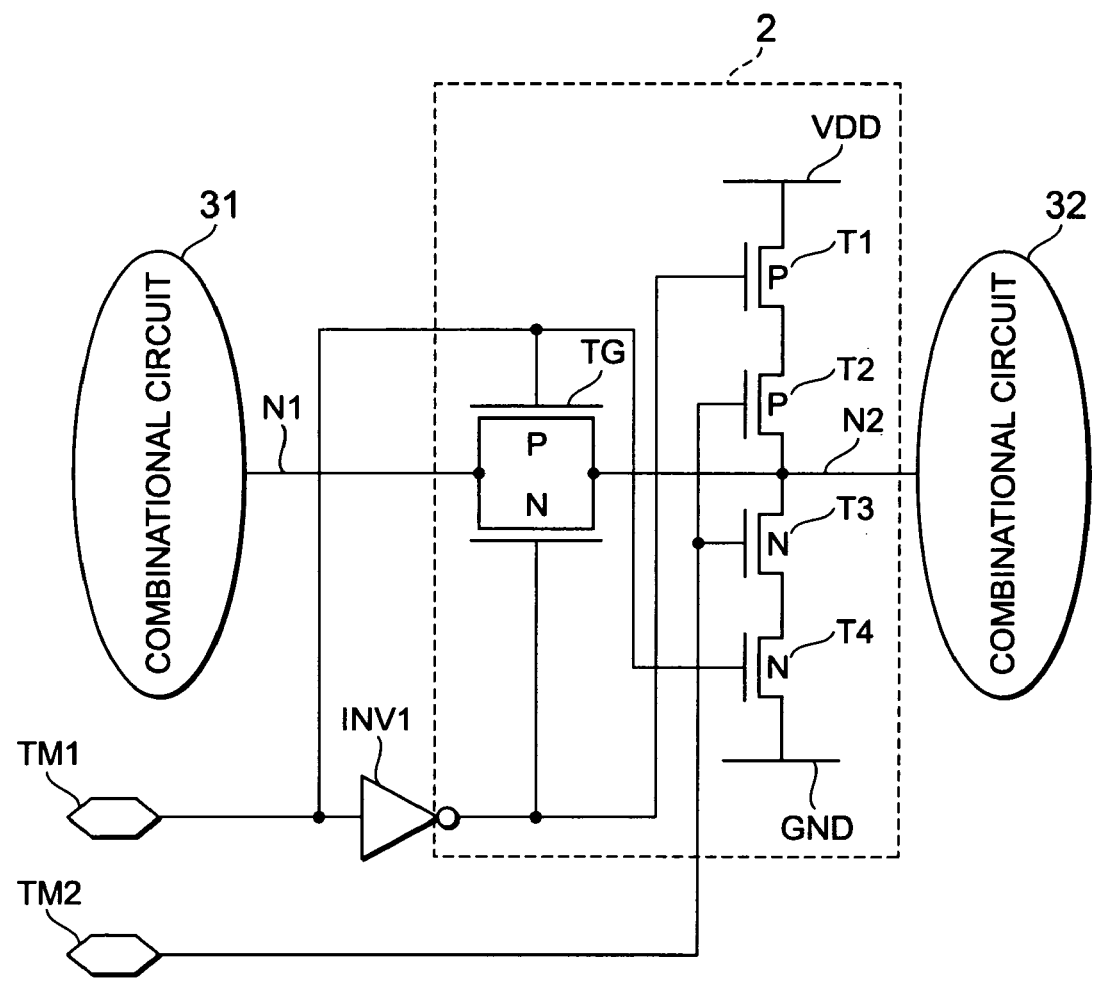
FIG. 11 is a block diagram of configurations of a test circuit and its peripheral circuits in the fourth embodiment of the present invention.

According to the configuration shown in FIG. 20, therefore, not only the first to fourth transistors T1 to T4 connected serially as shown in FIG. 13, but also the transistors shown in FIG. 11 can be built in a combinational circuit. Furthermore, the number of transistors is not limited only to four; even the first and second transistors T1 and T2 connected serially as shown in FIGS. 1, 3, and 7 respectively can be built in such a combinational circuit.

Optional Embodiments

Needless to say, the present invention is not limited only to the embodiments described above; it is to be understood that modifications will be apparent to those skilled in the art without departing from the spirit of the invention. For example, the test decoder TD shown in the block diagram of FIG. 4 and in the truth table of FIG. 5 is just an example for realizing the above logic. The test decoder TD can also take another circuit configuration if the circuit can realize the same function. The same may also be said of the test decoder TD shown in the block diagram of FIG. 8 and in the truth table of FIG. 9.

In FIG. 10, as an example, the scan clock signal supplied to the flip-flop circuit when in scan test operation is inputted to the test decoder TD. This scan clock may be replaced with another clock signal. Another clock signal used in the semiconductor device can also be used as the scan clock signal if the clock signal can be supplied for burn-in test operation.

Also in this case, burn-in or leak tests can be carried out with the same effects as those obtained above. Furthermore, the same may also be said of the case shown in FIG. 14.

In FIGS. 16 and 20 are used the P-well region Pwell and N-well region Nwell of the output block 33 and the input block 34 of the combinational circuit connected directly to the subject test circuit block. However, it is also possible to use the P-well region Pwell and N-well region Nwell of the output block 33 and the input block 34 of a combinational circuit that is not connected directly to the subject test circuit if the combinational circuit exists around the subject test circuit.

What is claimed is:

1. A test circuit disposed in a semiconductor device and combined with a combinational circuit therein, comprising:
 a first switching circuit connected between a first node and a second node;
 a second switching circuit connected between a first potential and the second node; and
 a third switching circuit connected between a second potential that is lower than the first potential and the second node,
 wherein each of the first to third switching circuits is turned on/off according to at least one control signal supplied from external, and
 wherein the test circuit is disposed together with the combinational circuit between plural flip-flop circuits included in a scan chain or between a flip-flop circuit included in the scan chain and a signal terminal of the semiconductor device.

2. A test circuit disposed in a semiconductor device and combined with a combinational circuit therein, comprising:
 a first switching circuit connected between a first node and a second node;
 a second switching circuit connected between a first potential and the second node; and
 a third switching circuit connected between a second potential that is lower than the first potential and the second node,
 wherein each of the first to third switching circuits is turned on/off according to at least one control signal supplied from external, and
 wherein the operations of the first to third switching circuits are independent of each other.

3. A test circuit disposed in a semiconductor device and combined with a combinational circuit therein, comprising:
 a first switching circuit connected between a first node and a second node;
 a second switching circuit connected between a first potential and the second node; and
 a third switching circuit connected between a second potential that is lower than the first potential and the second node,
 wherein each of the first to third switching circuits is turned on/off according to at least one control signal supplied from external, and
 wherein the second and third switching circuits can be turned off when the first switching circuit is turned on; and
 wherein either the second or third switching circuit can be turned on when the first switching circuit is turned off.

4. The test circuit according to claim 3,
 wherein the operations of the second and third switching circuits are synchronized with a clock signal.

5. The test circuit according to claim 4,
 wherein the clock signal is a scan clock signal supplied to the flip-flop circuits included in the scan chain when in scanning test operation.

* * * * *